United States Patent
Anthopoulos et al.

(10) Patent No.: US 12,382,695 B2
(45) Date of Patent: Aug. 5, 2025

(54) SELF-FORMING NANOGAP METHOD AND DEVICE

(71) Applicant: KING ABDULLAH UNIVERSITY OF SCIENCE AND TECHNOLOGY, Thuwal (SA)

(72) Inventors: Thomas D. Anthopoulos, Thuwal (SA); Kalaivanan Loganathan, Thuwal (SA); Emre Yarali, Thuwal (SA); Emre Yengel, Thuwal (SA); Hendrik Andreas Faber, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 533 days.

(21) Appl. No.: 17/640,886

(22) PCT Filed: Sep. 9, 2020

(86) PCT No.: PCT/IB2020/058378
§ 371 (c)(1),
(2) Date: Mar. 7, 2022

(87) PCT Pub. No.: WO2021/048758
PCT Pub. Date: Mar. 18, 2021

(65) Prior Publication Data
US 2022/0336597 A1    Oct. 20, 2022

Related U.S. Application Data

(60) Provisional application No. 62/993,937, filed on Mar. 24, 2020, provisional application No. 62/898,255, filed on Sep. 10, 2019.

(51) Int. Cl.
*H10D 64/20* (2025.01)
*H01L 21/283* (2006.01)
(Continued)

(52) U.S. Cl.
CPC ......... *H10D 64/205* (2025.01); *H01L 21/283* (2013.01); *H10D 30/6755* (2025.01);
(Continued)

(58) Field of Classification Search
CPC ............... H01L 29/413; H01L 29/0665; H01L 29/7869; H01L 29/66969; H01L 29/41733;
(Continued)

(56) References Cited

U.S. PATENT DOCUMENTS

| | | | |
|---|---|---|---|
| 5,512,131 A | 4/1996 | Kumar et al. | |
| 6,087,730 A * | 7/2000 | McGarvey | H01L 27/1214 257/E29.147 |

(Continued)

FOREIGN PATENT DOCUMENTS

| | | | | |
|---|---|---|---|---|
| CN | 107123686 B * | 6/2020 | | H01L 21/28 |
| EP | 1657070 A1 | 5/2006 | | |

(Continued)

OTHER PUBLICATIONS

R. Negishi, T. Hasegawa, K. Terabe, M. Aono, T. Ebihara, H. Tanaka, T. Ogawa; Fabrication of nanoscale gaps using a combination of self-assembled molecular and electron beam lithographic techniques. Appl. Phys. Lett. May 29, 2006; 88 (22): 223111. https://doi.org/10.1063/1.2209208 (Year: 2006).*

(Continued)

*Primary Examiner* — Sitaramarao S Yechuri
(74) *Attorney, Agent, or Firm* — PATENT PORTFOLIO BUILDERS PLLC

(57) ABSTRACT

A method for manufacturing a solid state device with a self-forming nanogap includes patterning a first metallic layer (M1) to form a first electrode on a substrate; depositing a self-assembling monolayer, SAM, layer over and around the first electrode; forming a second metallic layer (M2) in (Continued)

contact with the SAM layer and the substrate; and touchlessly removing parts of the second metallic layer (M2) that is formed directly above the SAM layer, to form a second electrode, and a nanogap between the first electrode and the second electrode.

19 Claims, 23 Drawing Sheets

(51) Int. Cl.
    H10D 30/67        (2025.01)
    H10D 62/10        (2025.01)
    G03F 7/00         (2006.01)

(52) U.S. Cl.
    CPC ....... *H10D 62/118* (2025.01); *G01N 2610/00* (2013.01); *G03F 7/0002* (2013.01)

(58) Field of Classification Search
    CPC . H01L 21/283; H01L 21/0331; H01L 21/321; H01L 31/02167; H01L 31/022425; G01N 2610/00; G03F 7/0002; B82Y 10/00; B82Y 40/00; H10D 64/205; H10D 30/6755; H10D 30/6729; H10D 62/118; H10D 99/00; H10F 77/211; H10F 77/311
    See application file for complete search history.

(56) References Cited

U.S. PATENT DOCUMENTS

| | | | |
|---|---|---|---|
| 2006/0154400 | A1 | 7/2006 | Choi et al. |
| 2007/0212522 | A1 | 9/2007 | Heidari et al. |
| 2008/0179586 | A1* | 7/2008 | Kamins .................. H01L 29/73 977/932 |
| 2010/0109203 | A1 | 5/2010 | Chen et al. |
| 2018/0269005 | A1* | 9/2018 | Zhu ....................... H01G 9/2018 |

FOREIGN PATENT DOCUMENTS

| | | |
|---|---|---|
| EP | 1864777 A1 | 12/2007 |
| JP | 2002305208 A | 10/2002 |
| WO | 2005083519 A2 | 9/2005 |

OTHER PUBLICATIONS

S. Dhariwal, R. Prajesh, A. Agarwal, S. Dhariwal, R. Prajesh and A. Agarwal, "Nanogap electrode formation by sacrificial layer technique," 2014 IEEE 2nd International Conference on Emerging Electronics (ICEE), Bengaluru, India, 2014, pp. 1-3, doi: 10.1109/ICEmElec.2014.7151156 (Year: 2014).*

Anthopoulos, T.D., et al., "Large-Area Nano-Structured Electronics for Energy Harvesting (LANE)", Competitive Research Grants (CRG) Program, 2018 CRG proposal Framework, King Abdullah University of Science and Technology, Office of Sponsored Research, 2018, pp. 1-22.

Beesley, D.J., et al., "Sub-15-nm patterning of asymmetric metal electrodes and devices by adhesion lithography," Nature Communications, vol. 5, Article 3933, May 27, 2014, pp. 1-9.

Chasin, A., et al., "Gigahertz Operation of a-IGZO Schottky Diodes," IEEE Transactions on Electron Devices, vol. 60, No. 10, Oct. 2013, pp. 3407-3412.

Chasin, A., et al., "Integrated UHF a-IGZO Energy Harvester for Passive RFID Tags," IEEE Transactions on Electron Devices, IEDM13-292 IEDM13-295, 2014, pp. 11.3.1-11.3.4.

Chasin, A., et al., "UHF IGZO Schottky Diode," Conference Paper, International Electronic Devices Meeting, IEDM Conference 2012, San Francisco, IEDM12-287 IEDM12-290, Dec. 2012, pp. 12.4.1-12.4.4.

Cui, A., et al., "Mass Production of Nanogap Electrodes toward Robust Resistive Random Access Memory," Advanced Materials, vol. 28, Issue 37, 2016 (Published online Jul. 20, 2016), pp. 8227-8233.

Cui, A., et al., "Nanogap Electrodes towards Solid State Single-Molecule Transistors," Small, vol. 11, Issue 46, 2015 (Published online Oct. 9, 2015), pp. 6115-6141.

Dellis, S., et al., "Rapid laser-induced photochemical conversion of sol-gel precursors to $In_2O_3$ layers and their application in thin-film transistors," Journal of Materials Chemistry C, vol. 5, Issue 15, 2017 (Open Access Article Published Mar. 22, 2017), pp. 3673-3677.

Gao, P., et al., "Self-Aligned Sub-10-nm Nanogap Electrode Array for Large-Scale Integration," Small, vol. 7, Issue 15, 2011 (Published online May 31, 2011), pp. 2195-2200.

Ji, D., et al., "Nanosphere Lithography for Sub-10-nm Nanogap Electrodes," Advanced Electronic Materials, Supporting Information, 2016, pp. 1-10 (11 pages total).

Ji, D., et al., "Nanosphere Lithography for Sub-10-nm Nanogap Electrodes," Advanced Electronic Materials, vol. 3, No. 1, 1600348, 2017 (Published online Dec. 8, 2016), pp. 1-5.

Kang, C., et al., "High-Performance, Solution-Processed Indium-Oxide TFTs Using Rapid Flash Lamp Annealing," IEEE Electron Device Letters, vol. 37, No. 5, May 2016 (Date of Publication Mar. 13, 2016; date of current version Apr. 22, 2016), pp. 595-598.

Kim, D.W., et al., "Rapid Curing of Solution-Processed Zinc Oxide Films by Pulse-Light Annealing for Thin-Film Transistor Applications," Electronic Materials Letters, vol. 11, No. 1, 2015 (Published Jan. 10, 2015), pp. 82-87.

Kwon, N., et al., "Fabrication of quantum dots using multicoated self-assembled monolayer," Journal of Vacuum Science and Technology, Part A, vol. 28, No. 4, Jul./Aug. 2010 (Published Jun. 29, 2010), pp. 730-734.

Lee, W.H., et al., "Printed In—Ga—Zn—O drop-based thin-film transistors sintered using intensely pulsed white light," RSC Advances, vol. 5, 2015 (Published Sep. 10, 2015), pp. 78655-78659.

Li, T., et al., "Nanogap Electrodes," Advanced Materials, vol. 22, Issue 2, 2010 (Published online Jul. 20, 2009), pp. 286-300.

Negishi, R., et al., "Fabrication of nanoscale gaps using a combination of self-assembled molecular and electron beam lithographic techniques," Applied Physics Letters, vol. 88, Issue 22, 2006 (Published online Jun. 2, 2006), pp. 223111-1-223111-3.

Park, S.C., et al., "Advanced photo-annealing of indium zinc oxide films for thin-film transistors using pulse UV light," Journal of Information Display, vol. 17, No. 1, 2016 (Published online Mar. 30, 2016), pp. 1-7 (8 pages total).

PCT International Search Report (Form PCT/ISA/210) for corresponding/related International Application No. PCT/IB2020/058378 dated Feb. 2, 2021.

PCT Written Opinion of the International Searching Authority (Form PCT/ISA/237) for corresponding/related International Application No. PCT/IB2020/058378 dated Feb. 2, 2021.

Semple, J., et al., "Analysis of Schottky Contact Formation in Coplanar Au/ZnO/Al Nanogap Radio Frequency Diodes Processed from Solution at Low Temperature," ACS Applied Materials & Interfaces, vol. 8, No. 35, 2016 (Published Aug. 17, 2016), pp. 23167-23174.

Semple, J., et al., "Flexible diodes for radio frequency (RF) electronics: a materials perspective," Semiconductor Science and Technology, vol. 32, No. 12, Article 123002, 2017 (Published Oct. 30, 2017), pp. 1-45 (46 pages total).

Semple, J., et al., "Large-area plastic nanogap electronics enabled by adhesion lithography," NPJ Flexible Electronics, vol. 2, No. 18, 2018 (Published online Jun. 25, 2018), pp. 1-10.

Semple, J., et al., "Radio Frequency Coplanar ZnO Schottky Nanodiodes Processed from Solution on Plastic Substrates," Small, vol. 12. Issue 15, 2016 (First Published Feb. 25, 2016), pp. 1-8.

Semple, J., et al., "Semiconductor-Free Nonvolatile Resistive Switching Memory Devices Based on Metal Nanogaps Fabricated on Flexible Substrates via Adhesion Lithography," IEEE Transactions on Electron Devices, vol. 64, No. 5, May 2017 (Date of Publication Jan. 2, 2017; date of current version Apr. 19, 2017), pp. 1973-1980.

(56) References Cited

OTHER PUBLICATIONS

Serdio, V.M., et al., "Gap separation-controlled nanogap electrodes by molecular ruler electroless gold plating," RSC Advances, vol. 5, 2015 (Open Access Article—Published Feb. 18, 2015), pp. 22160-22167.
Strobel, S., et al., "Planar Nanogap Electrodes by Direct Nanotransfer Printing," Small, vol. 5, Issue 5, 2009, pp. 579-582.
Talukder, S., et al., "Electrolithography—A New and Versatile Process for Nano Patterning," Scientific Reports, vol. 5, Article 17753, Dec. 4, 2015, pp. 1-11.
Tanaka, H., et al., "Position-Selected Molecular Ruler," Japanese Journal of Applied Physics, vol. 43, No. 7B, 2004 (Published Jun. 25, 2004), pp. L950-L953.
Tetzner, K., et al., "The impact of post-deposition annealing on the performance of solution-processed single layer $In_2O_3$ and isotype $In_2O_3$/ZnO heterojunction transistors," Journal of Materials Chemistry C, vol. 5, Issue 1, 2017 (Published Dec. 15, 2016), pp. 59-64.
Tripathi, L.N., et al., "Quantum dots-nanogap metamaterials fabrication by self-assembly lithography and photoluminescence studies," Optics Express, vol. 23, No. 11, Jun. 1, 2015 (Published May 29, 2015), pp. 14937-14945.
Wu, G., et al., "Silicon Oxide Electron-Emitting Nanodiodes," Supporting Information, ResearchGate, Preprint May 2018, pp. 1-8 (9 pages total).
Wyatt-Moon, G., et al., "Deep Ultraviolet Copper(I) Thiocyanate (CuSCN) Photodetectors Based on Coplanar Nanogap Electrodes Fabricated via Adhesion Lithography," ACS Applied Materials & Interfaces, vol. 9, No. 48, 2017 (Published Nov. 27, 2017), pp. 41965-41972.
Yoo, T.-H., et al., "Sub-second photo-annealing of solution-processed metal oxide thin-film transistors via irradiation of Intensely pulsed white light," RSC Advances, vol. 4, Issue 37, 2014 (Published Apr. 28, 2014), pp. 19375-19379.
Zhang, J., et al., "Flexible indium-gallium-zinc oxide Schottky diode operating beyond 2.45 GHZ," Nature Communications, vol. 6, Article 7561, Jul. 3, 2015, pp. 1-7.
Aragonès, A.C., et al., "Electrostatic catalysis of a Diels-Alder reaction," Nature, vol. 531, Article 7592, Mar. 3, 2016, pp. 88-91.
Carcenac, F., et al., "Fabrication of multiple nano-electrodes for molecular addressing using high-resolution electron beam lithography and their replication using soft imprint lithography," Microelectronic Engineering, vols. 61-62, Jul. 1, 2002, pp. 657-663.
Chen, X., et al., "Atomic layer lithography of wafer-scale nanogap arrays for extreme confinement of electromagnetic waves," Nature Communications, vol. 4, Article 2361, Sep. 3, 2013, pp. 1-7.
Chen, X., et al., "Nanogap-Enhanced Infrared Spectroscopy with Template-Stripped Wafer-Scale Arrays of Buried Plasmonic Cavities," Nano Letters, vol. 15, No. 1, Jan. 14, 2015 (Published on the Web Nov. 25, 2014), pp. 107-113.
Fang, F.Z., et al., "Nanomanufacturing—Perspective and applications," CIRP Annals—Manufacturing Technology, vol. 66, No. 2, 2017 (Available online Jun. 9, 2017), pp. 683-705.
Gates, B.D., "Nanofabrication with molds & stamps," Materials Today, vol. 8, No. 2, Feb. 2005, pp. 44-49.
Office Action in corresponding/related U.S. Appl. No. 17/640,890, notification date of Mar. 14, 2024.
Ou, T.-H., et al., "Detection of Fake Alcoholic Beverages Using Electrolyte-Free Nanogap Electrochemical Cells," ACS Applied Materials & Interfaces, vol. 11, 2019 (Published Jan. 21, 2019), pp. 6217-6223.
PCT International Search Report and Written Opinion of the International Searching Authority (Forms PCT/ISA/220, PCT/ISA/210 and PCT/ISA/237) for corresponding/related International Application No. PCT/IB2020/058380 dated Feb. 2, 2021.
Srinivasan, C., et al., "Molecular-ruler nanolithography," Proceedings of SPIE, vol. 6517, Mar. 15, 2007, pp. 651711-1-651711-9.
Wang, Y., et al., "Field-Assisted Splitting of Pure Water Based on Deep-Sub-Debye-Length Nanogap Electrochemical Cells," ACS Nano, vol. 11, 2017 (Published Jul. 7, 2017), pp. 8421 8428.
Xia, Y., et al., "Soft Lithography," Angewandte Chemie International Edition, Verlag Chemie, vol. 37, XP000985399, Jan. 1, 1998, pp. 551-575.

* cited by examiner

SELF-FORMING NANOGAP METHOD AND DEVICE

CROSS-REFERENCE TO RELATED APPLICATIONS

This application is a U.S. National Stage Application of International Application No. PCT/IB2020/058378, filed on Sep. 9, 2020, which claims priority to U.S. Provisional Patent Application No. 62/898,255, filed on Sep. 10, 2019, entitled "SELF-FORMING NANOGAP METHOD AND DEVICE," and U.S. Provisional Patent Application No. 62/993,937, filed on Mar. 24, 2020, entitled "SELF-FORMING NANOGAP METHOD AND DEVICE," the disclosures of which are incorporated herein by reference in their entirety.

BACKGROUND

Technical Field

Embodiments of the subject matter disclosed herein generally relate to a system and method for manufacturing a solid state device, and more specifically, to a self-forming nanogap method that can be used to make solid state devices.

Discussion of the Background

The emergence of the Internet of Things (IoT) has triggered a surge of innovation that extends far beyond the electronics industry. The early activity in this field focused on the connectivity of an ecosystem of physical devices (sensors, actuators, vehicles, home appliances and many other items embedded with electronics) to a network that enables these objects to communicate, but also to exchange data. Analysts now predict that the installed base for IoT devices will grow to 30 billion devices by 2020, from 10 billion today. As billions, and soon trillions, of IoT devices begin to emerge, the issue of powering them becomes critical, and currently is considered as one of the main technology roadblocks.

The magnitude of the problem is better understood if one considers the fact that all current wireless electronic devices rely on cables to either charge a storage unit (battery or capacitor) from a fixed power source or require battery replacement. Although, this traditional battery-centric device model operation has allowed todays state-of-the-art electronics to operate wirelessly, for the future IoT ecosystem, this battery-centric model does not appear viable due to significant economic (cost of battery), technical (slow battery charging/limited operating time and lifetime) and environmental (processing of battery wastes) challenges.

For these reasons, energy-harvesting technologies capable of harnessing energy wirelessly from ambient sources, such as heat, vibration, friction and electromagnetic waves, have been receiving increasing attention in recent years. It is now becoming evident that untying the electrical power and electronic device functionality by enabling efficient wireless power transfer, would not only trigger the broader adoption of existing technologies, but it would also lead to new technology concepts and future applications within the IoT ecosystem, and particularly, self-sustainable, standalone wireless sensor platforms.

There are a number of wireless energy harvesting (WEH) technologies available today, some of which include photovoltaic systems (systems that harvest the solar energy and transform it into electrical power), thermoelectric systems (systems that harvest the ambient heat and transform it into electrical power), piezoelectric systems (systems that harvest mechanical energy and transform it into electrical power), and radio-frequency (RF) systems (systems that harvest electromagnetic waves and transform it into electrical power). The RF energy is particularly attractive as it is readily available through the widely deployed communication networks that include wireless local networks (WLANs), wireless sensor networks (WSNs), Wi-Fi base stations, smart wireless portable devices (phones, tablets, laptops, etc.), TV, radio and satellite signals.

However, the RF energy has limitations like limited power density, strong dependence to the distance from the source and its emitted energy, and its total reliance on a limited range of high performance electronic devices that can operate at the required RF bands. Despite that, recent work has demonstrated RF WEH systems capable of self-powering a microcontroller-enabled sensor platform by harvesting ultrahigh-frequency TV signal broadcasted 6.3 km away. Despite this promising work, however, there are still significant economic obstacles (cost of diodes, passive RF components and system integration) and technological challenges (e.g., inadequate diode performance) that would need to be addressed before RF WEH systems can be produced at large scale.

However, the existing methods for building the solid state devices to be used with these technologies have reached their limits in terms of cost and miniaturization level. Therefore, there is a need to build and integrate RF components into everyday devices in radically new and cost-effective ways, using scalable methods for generating inexpensive and self-sustainable solid state systems for a range of applications within the IoT.

SUMMARY

According to an embodiment, there is a method for manufacturing a solid state device with a self-forming nanogap. The method includes patterning a first metallic layer (M1) to form a first electrode on a substrate, depositing a self-assembling monolayer, SAM, layer over and around the first electrode, forming a second metallic layer (M2) in contact with the SAM layer and the substrate, and touchlessly removing parts of the second metallic layer (M2) that is formed directly above the SAM layer, to form a second electrode, and a nanogap between the first electrode and the second electrode.

According to another embodiment, there is a solid state transistor that includes a substrate, a first electrode formed on the substrate, a second electrode formed on the substrate, a nanogap formed between the first and second electrodes, a third electrode formed in the nanogap to form additional first and second nanogaps, a dielectric material formed over the third electrode, and a semiconductor material formed over the dielectric material. The dielectric material and the semiconductor material extend into the first and second additional nanogaps.

According to yet another embodiment, there is a solid state diode that includes a substrate, a first electrode formed on the substrate, a second electrode formed on the substrate, a nanogap formed between the first electrode and the second electrode, an oxidization layer formed on the first electrode, and a semiconductor material formed in the nanogap. The oxidization layer and the semiconductor material extend into the nanogap.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

Figure 1:
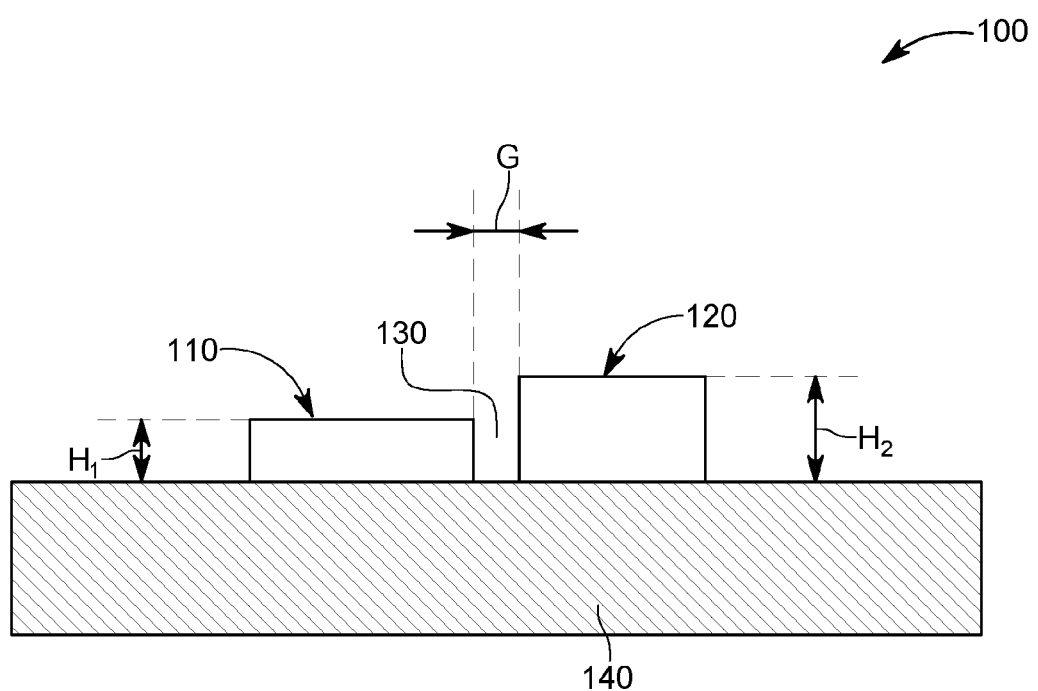
FIG. 1 is a schematic illustration of a solid state device having a nanogap formed with a self-forming nanogap method.

The following description of the embodiments refers to the accompanying drawings. The same reference numbers in different drawings identify the same or similar elements. The following detailed description does not limit the invention. Instead, the scope of the invention is defined by the appended claims.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

According to an embodiment, there is a fabrication process that allows the formation of conductive electrodes, either symmetric, i.e., using the same material, or asymmetric, i.e., using a dissimilar material, which are spaced apart by a gap of nanoscale size, i.e., in the range of 1-100 nm. The conductive electrodes may be made of different materials, such as metals, transparent conductive oxides (e.g., indium tin oxide, ITO), conductive polymers, graphene, to name a few. The conductive electrodes may be formed as an individual layer or a multilayer structure. For the sake of simplicity, this application uses the term 'metallic' electrodes herein to include all of the above mentioned material options and also uses the term "metallization" to include the application of any such layers to a substrate.

According to this embodiment, the gap formation occurs at a boundary of an initially deposited, patterned, surface treated metallic layer M1 and a second conductive layer M2. This is achieved by inserting a SAM layer and a thin "interlayer" of titanium (Ti), or other metals/metal oxides with suitable surface chemistry, in-between the first and second conductive layers M1 and M2. In one application, the thin interlayer is considered to be part of the second metallic layer M2. However, the thin interlayer can be also treated as an independent layer from the second metallic layer M2. Examples for alternative interlayers may include Al or Cr. The method can be implemented by depositing/growing the interlayer onto the SAM layer, which is deposited on a surface of the layer M1, followed by the deposition of the layer M2. The SAM layer creates a hydrophobic, non-sticky surface on top of the first conductive layer M1, with a low-surface energy, which would not make a strong bond with the second conductive layer M2. In addition, the SAM layer would be easily removable from the first conductive layer M1. The SAM layer that is formed on the M1 layer can be removed later, for example, with a short UV/ozone or plasma treatment. However, the SAM layer still offers a good adherence to the first conductive layer M1 and thus, after the second conductive layer M2 is formed on the SAM layer, those parts of the second conductive layer M2, which are formed on the SAM layer on top of the first conductive layer M1, would be easily removable when agitated in a liquid, or exposed to a high flow of a fluid, which may be a fluid or gas (e.g., air), as discussed later in more detail. The Ti interlayer thickness can be tuned in the range of 1 to 500 nm and its deposition is often followed by the deposition of the M2 layer, typically platinum (Pt), also of arbitrary thickness that may be in the range of 10 to 500 nm. The inventors have found that the incorporation of the Ti interlayer and SAM layer on first conductive layer M1 decreases the adhesive forces between the two conductive layers M1 and M2, allowing the easy removal of overlapping regions (regions of layer M2 overlapping the layer M1) upon gentle agitation of the substrate (by various means including gas pressure jet, sonication in a liquid bath) or by simply directing a fluid jet over the second conductive layer M2, without further need of complicated or expensive equipment or processing steps, hence the name 'self-forming' nanogap electrodes. The process discussed herein can be extended to multiple metallization layers depending on the target application, a few examples of which will be discussed later.

By filling or covering the empty nanogaps with semiconducting, dielectric, conducting, piezoelectric, ferroelectric, piezo-resistive, electrolytic, and/or an electrolyte material, electronic devices of various kinds can be fabricated with minimum complexity and high-yield, due to the self-forming nature of the process. Post-deposition processing steps can then be carried out via traditional methods, i.e., thermal annealing or other conventional means, in order to chemically convert or modify the chemistry and microstructure of the material in the nanogap. To this end, the inventors have realized that the nanometer dimensions of the formed gap between the first and second layers M1 and M2 enables novel ways of processing the active materials deposited inside the nanogap, i.e., in-between the layers M1 and M2.

An extremely fast (microseconds to seconds) and efficient method for achieving this processing is via photonic annealing, and/or photo-chemical treatment of the material deposited in-between the layers M1 and M2, as will be discussed later in more detail.

In this process, the metal nanogap containing a suitable precursor material deposited in-between layers M1 and M2, is exposed to an intense pulse of light (generated, for example, by a broad or narrow spectra lamp, e.g., xenon, or other light sources such as a laser diode) of different duration and intensity, depending on (i) the electrode material, (ii) the active material in the nanogap, (iii) the nanogap architecture, (iv) the overall device geometry, and (v) the material combinations.

The high intensity of the light pulse(s) is partially absorbed by the conductive layers and/or the active material itself, which is deposited in the gap or beneath/above the nanogap electrodes. If the light is absorbed by the metal electrodes, it subsequently raises the temperature of the layers M1 and M2, between room temperature to over 1000° C., within a short timeframe (from microseconds to seconds) because of their small size. Because of the nanometer dimensions separating the two electrodes, heat can propagate almost instantaneously and momentarily across the nanogap, leading to the subsequent conversion of a precursor compound pre-deposited into the nanogap, to a functional material (semiconductor, dielectric, conductor or other functional material etc.). Because of the short duration of the photonic curing step, the process can be implemented on arbitrary substrate materials, a few examples of which include glass, plastic, paper using additive methods such as roll-to-roll (R2R), sheet-to-sheet (S2S), to name but a few, because the short duration of the process does not produce enough heat to damage the substrate material, even if the substrate material is heat sensitive. This is very advantageous when the metal or other material that is deposited inside the nanogap needs a high temperature for processing, but the substrate cannot withstand that high temperature.

Also, the nanogap electrodes can be integrated to form either single, discrete, electronic devices, such as diodes, capacitors, transistors, photodiodes, light emitting diodes, etc., or integrated circuits for logic or analog opto-electronic applications. Both the self-forming nanogaps features as well as the application of the photonic curing allow for the fabrication of these devices on arbitrary substrates and surfaces, at any scale, and with minimum operator involvement as the entire process may be automated and performed under the supervision of an electronic controller.

A self-forming nanogap based solid state device 100 is now discussed with regard to FIG. 1. The device 100 includes self-forming coplanar nanogap electrodes 110 and 120 that are separated by a gap 130 having a width G, which is 100 nm or smaller. The width G of the nanogap is measured along the substrate, between the first electrode 110 and the second electrode 120. In one embodiment, the width G is 100 nm or smaller. In another embodiment, the width G is 20 nm or smaller. The electrodes 110 and 120 are formed on a substrate 140, and the layers have heights H1 and H2, respectively. The heights may be or not the same. The substrate 140 may be glass and the first and second layers may be made of the same or different materials. For example, in one application, the first and second layers are made of Al. In another application, the first layer is made of Al and the second layer is made of a combination of Ti and Pt. Other materials may be used are discussed later. A length of the first and second layers may vary between mm to cm. While FIG. 1 shows the gap 130 being empty, as discussed later, it is possible to fill the gap with one or more materials to form other devices, such as diodes or transistors.

Figure 2:
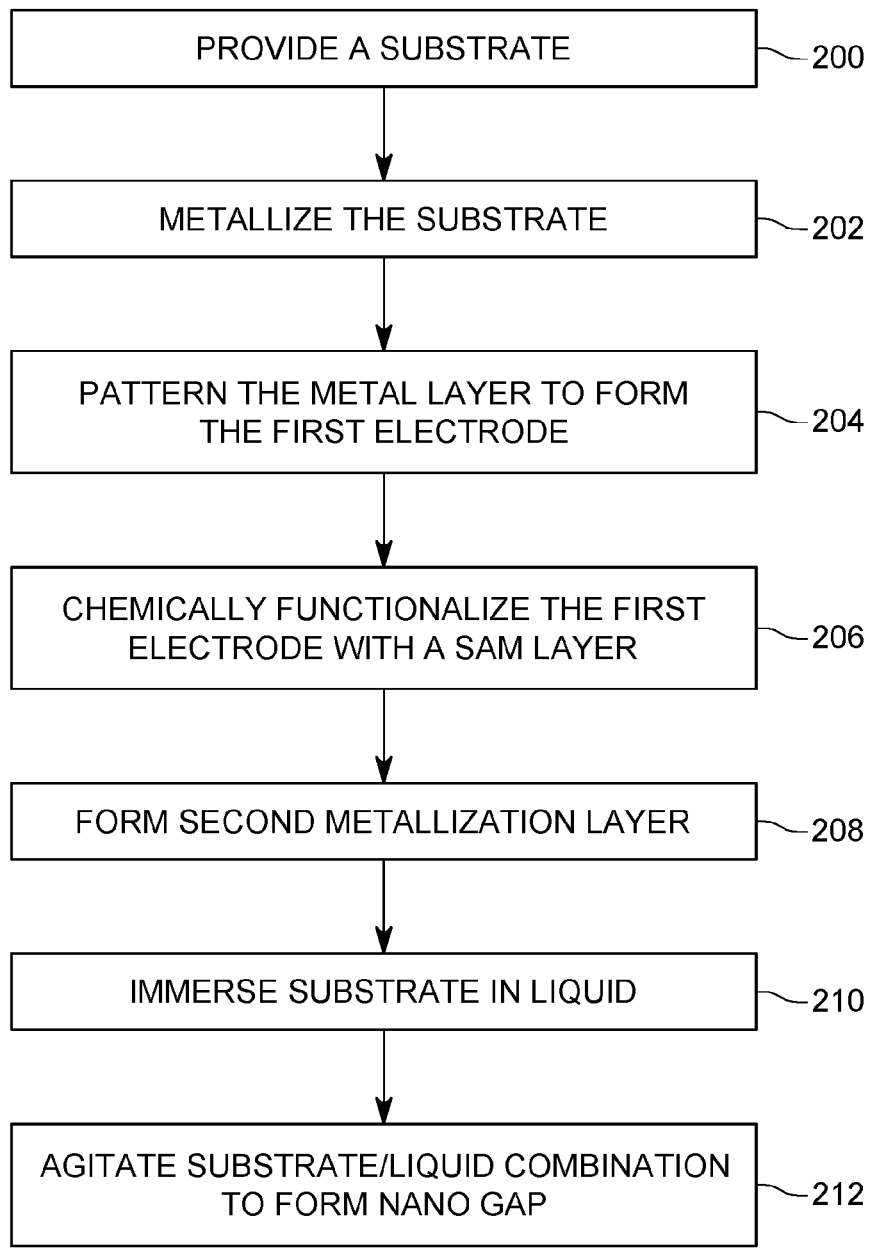
FIG. 2 is a flowchart of the self-forming nanogap method.

A method for forming the self-forming nanogap based device 100 of FIG. 1 is now discussed with regard to FIG. 2. The method includes a step 200 of providing the substrate 140. There is a large variety of substrate materials that can be chosen for this step. While glass and Si wafers with a thermally grown oxide layers are the standard materials for the semiconductor devices, flexible plastic substrates can be used as well. Generally, any material that (1) offers a good adhesion to the chosen layers M1 and M2, and (2) does prevent the molecules of a self-assembling monolayer (SAM) to form a monolayer is suitable for the substrate. When these requirements are not met, an interfacial buffer layer, exhibiting appropriate surface chemistry, may be formed on top of the substrate to nevertheless render the substrate material valid for the self-forming process of nanogaps. It is additionally possible that an active material (semiconductor or dielectric) is already present on the substrate 140, before the start of the nanogap fabrication, (i.e., before the deposition of the layers M1 and M2 and/or other functional materials), which would create the electrodes on top of the active material.

Figure 3A:
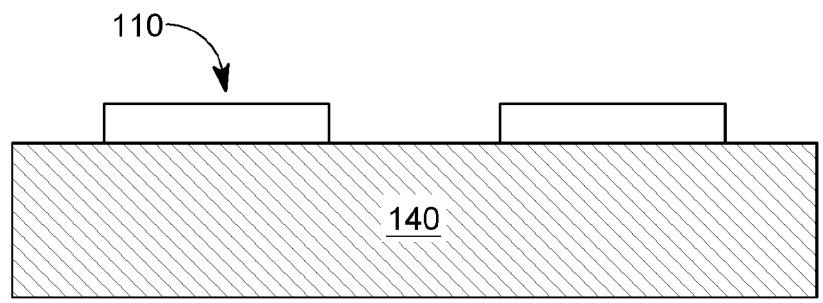
FIGS. 3A to 3E illustrate the various stages of a solid state device formed with the self-forming nanogap method.

In step 202, the substrate 140 is metallized to form the first layer M1, which in this specific embodiment is chosen to be an aluminum layer of a given thickness H1. In one application, the thickness H1 is selected to be 100 nm or less. The first metallic layer M1 may be deposited using thermal or e-beam evaporation deposition techniques (familiar to those skilled in the art) and then it can be patterned in step 204, via standard photolithography, to obtain the first electrode 110, as shown in FIG. 3A. Note that plural first electrodes 110 may be formed on the substrate 140. In one embodiment, the first electrodes 110 are formed directly on the substrate. The first electrodes 110 may be patterned to have any desired shape.

However, the deposition of the first metallic layer M1 is not limited to thermal or e-beam evaporation, but may include other common vacuum deposition methods, such as sputtering or pulsed laser deposition. Additionally, solution based printing or growth methods may also be used. The patterning of the first metallic layer M1 to obtain the electrode 110 can be achieved via standard lithography and lift-off or etching protocols. Other options include, but are not limited to: shadow-masking during evaporation, laser ablation, soft lithography, micromolding, or other printing techniques.

Figure 3B:
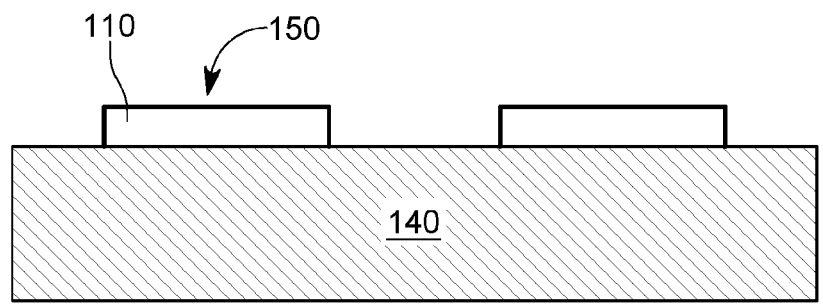

For this specific embodiment, because the first electrode 110 is formed of aluminum, a native aluminum oxide (alumina) layer is formed upon exposure to air. Then, the first electrode 110 is chemically functionalized in step 206 with a SAM layer 150, as shown in FIG. 3B. The SAM layer 150 is made in this embodiment of small organic molecule such as octadecylphosphonic acid (ODPA). In one application, the SAM layer 150 may be achieved by creating a solution of ODPA in IPA (Iso-Propyl Alcohol) with a given concentration and submersing the metalized substrate 140 in the solution for a fixed period of time. Next, the substrate is rinsed with excess IPA and dried on a hotplate at elevated temperature of 70° C. for several minutes. The precise method of SAM functionalization may vary in accordance to established protocols.

However, a SAM layer includes molecular assemblies formed spontaneously on surfaces by adsorption and are organized into more or less large ordered domains. In some cases, molecules that form the monolayer do not interact strongly with the substrate (note that the substrate in this paragraph refers to the material to which the SAM layer is formed upon, i.e., the first electrode 110 in FIG. 1, and not the substrate 140). This is the case, for instance, of the two-dimensional supramolecular networks of e.g., perylenetetracarboxylic dianhydride (PTCDA) on gold or of e.g., porphyrins on highly oriented pyrolitic graphite (HOPG). In other cases, the molecules possess a head group that has a strong affinity to the substrate and anchors the molecule to it. Such a SAM consisting of a head group, tail and functional end group may include head groups such as thiols, silanes, phosphonates, etc. The SAM layers are created by the chemisorption of the "head groups" onto the substrate from either the vapor or liquid phase followed by a slow organization of "tail groups". The "head groups" assemble together on the substrate, while the tail groups assemble far from the substrate. Areas of close-packed molecules nucleate and grow until the surface of the substrate is covered in a single monolayer.

The molecules that forms the SAM layer 150 on top of the first electrode 110 are selected with two goals in mind. The first goal is to change the surface properties of the first electrode 110. The molecule chain and tail group of the SAM layer 110 should be chosen to create a hydrophobic (low-surface energy), non-sticky surface on top of the first electrode with a low-surface energy. The pure alkyl chain of ODPA is a good example for this. Meanwhile, other possible candidates include, for example, alkyl/aromatic chains with different number of carbons or fluorinated chains.

The second goal of the SAM material is the selective binding of the head group. The phosphonic acid based ODPA used in this embodiment is known to bind to certain metal oxide surfaces such as the native alumina, but not to, for example, non-oxide surfaces such as plastic substrate, or substrates covered by a such inter layer that can be processed atop prior to metal and SAM deposition. This way, the adhesion of the second layer M2 with the substrate surface (or the surface of the interlayer) stays unaltered while the adhesion towards the first layer M1 is diminished. The head group can be changed depending on the nature of the first layer M1 and needs to be matched/selected accordingly amongst several existing options.

For example, thiol-based molecules are known to attach preferentially onto noble metals such as gold, platinum or silver whereas phosphonic acids do not. The SAM layer deposition step is mostly carried out via self-assembly from the liquid phase (SAM molecules are dissolved in solvent), but a gas phase deposition is also possible.

Figure 4A:
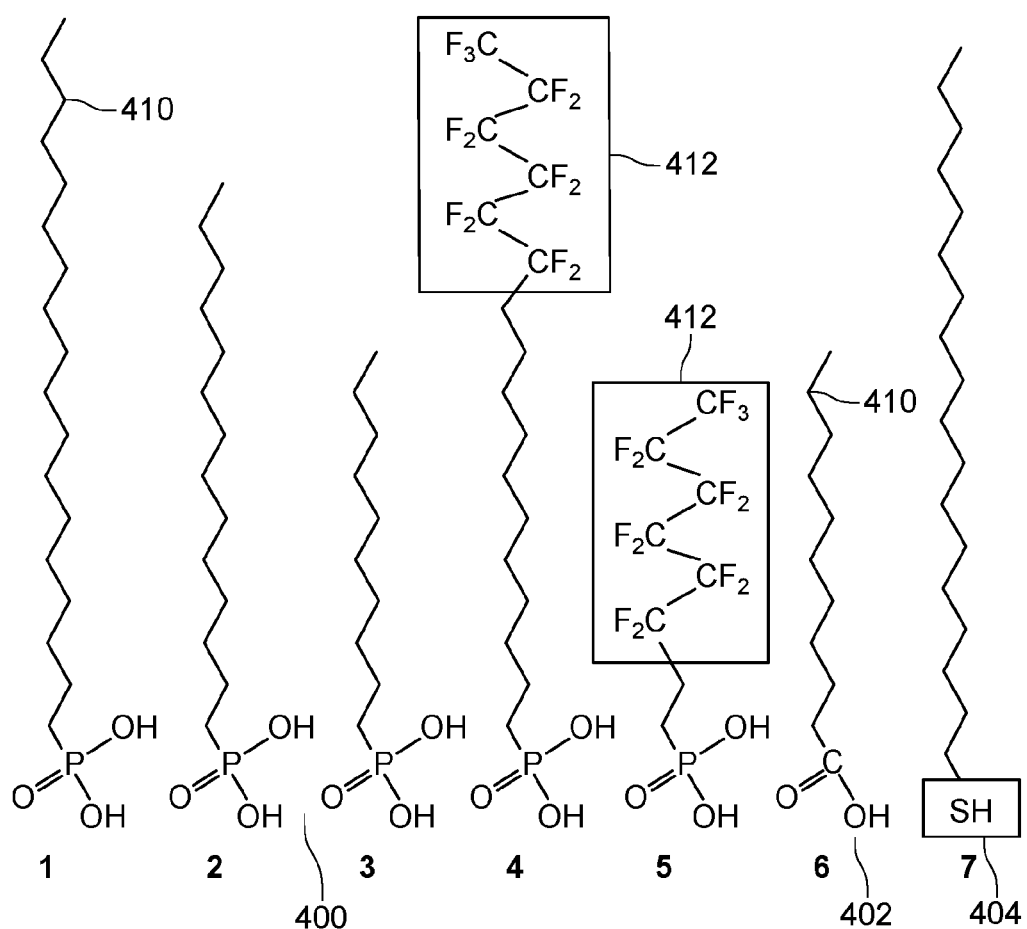
FIGS. 4A to 4C illustrate various self-assembling monolayers (SAMs) used with the self-forming nanogap method.
Figure 4B:
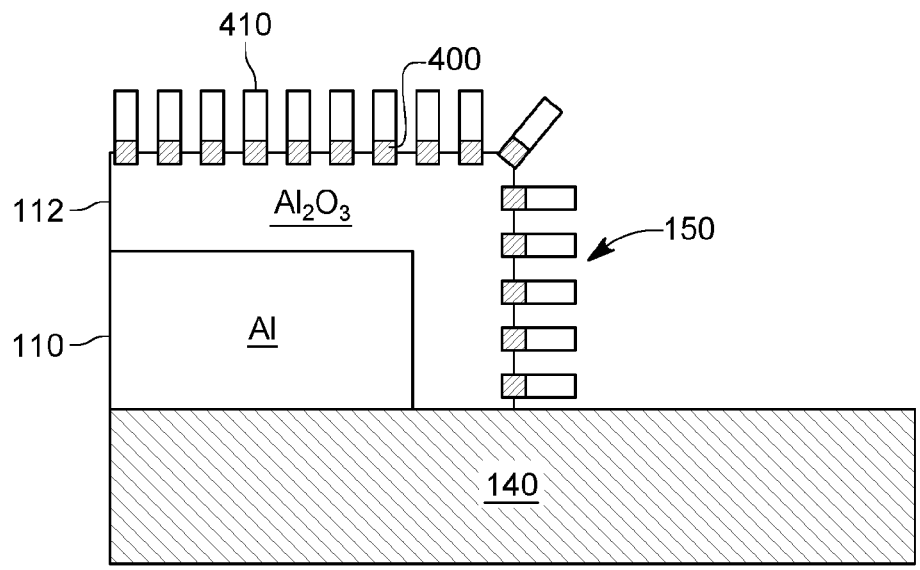
Figure 4C:
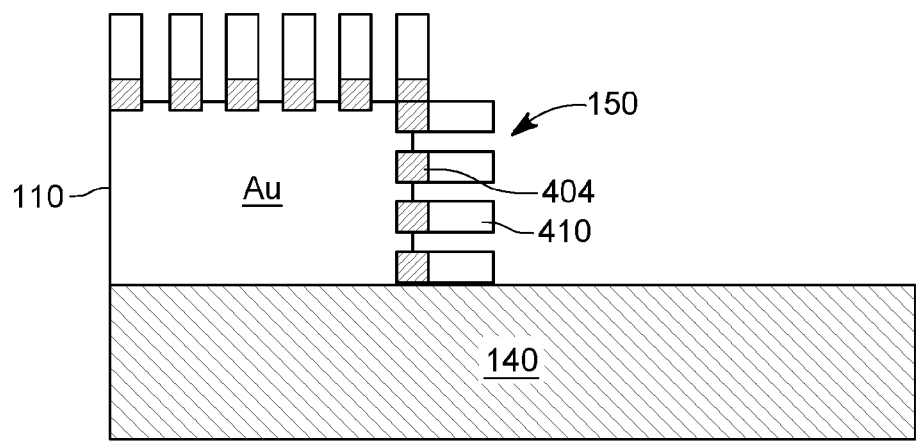

A few examples of possible SAM forming molecules as well a conceptual visualization of the SAM selection criteria are illustrated in FIGS. 4A to 4C. FIG. 4A shows 7 different SAM materials having a head group (bottom region of the figure), a chain part (middle region of the figure) and an end group (top region of the figure). Note that examples 1-3, 6, and 7 have the end group very similar to the chain part while examples 4 and 5 have the three groups distinct from each other. The head group may include the phosphonic acid 400, or the carboxylic acid 402, or the thiol 404, while the chain/end groups may include an alkyl 410 or a fluorinated element 412.

The first example 1 of SAM material is Octadecylphosphonic acid, the second example 2 is: Tetradecylphosphonic acid, the third example 3 is Decylphosphonic acid, the fourth example 4 is: 12,12,13,13,14,14,15,15,16,16,17,17-Tridecafluoroseptadecylphosphonic acid, the fifth example 5 is: 3,3,4,4,5,5,6,6,7,7,8,8,8-Tridecafluorooctylphosphonic acid, the sixth example 6 is: Decanoic acid, and the seventh example 7 is: Octadecanethiol.

FIGS. 4B and 4C schematically illustrate the selective binding of different SAM molecules. For example, FIG. 4B shows a first electrode 110 made of Al on the substrate 140, and the oxide layer 112 formed at the surface of the first electrode 110. A phosphonic acid (group 400 in FIG. 4A) based SAM layer 150 is binding to a native or grown alumina layer 112 on the first Al electrode 110. FIG. 4B shows a thiol (group 404 in FIG. 4A) based SAM layer 150 binding to the surface of a first Au electrode 110. In either case, the SAM layer 150 does not form a strong bond with the chosen surface.

Figure 3C:
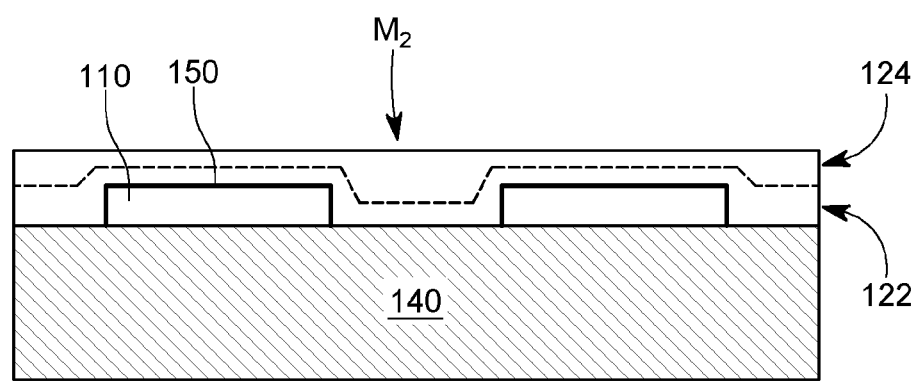

Returning to FIG. 2, the method then advances to step 208, in which the second metallization layer M2 is formed over the SAM layer 150 and over the exposed substrate 140, as shown in FIG. 3C. The second layer M2 may have a thickness of about 50 to 200 nm, but preferably 100 nm. In one embodiment, the second layer M2 is formed to include a first thin layer 122 (e.g., less than 20 nm, preferably 5 nm) of titanium (which may be considered to be the interlayer discussed above) and a second thick layer 124 (e.g., less than 200 nm, but preferably 100 nm) of platinum. The two layers are schematically illustrated in FIG. 3C, but not at scale. The two layers 122 and 124 may be deposited by e-beam evaporation, or other methods, over the pre-patterned first electrodes 110 on the substrate.

The kind of metal that can be employed for the first layer M1 is connected to the availability of a suitable SAM forming molecule. Some examples of these metals are Al, Au, Ti, Mo, In, Zn, and ITO, but a much wider selection is possible. The second layer M2 for the self-forming nanogap procedure may include a combination of the thin layer 122 (thickness in the range 1-100 nm) of titanium (or others mentioned above) followed by the second layer 124, e.g., a platinum layer. Other materials instead of Pt may be used.

Figure 3D:
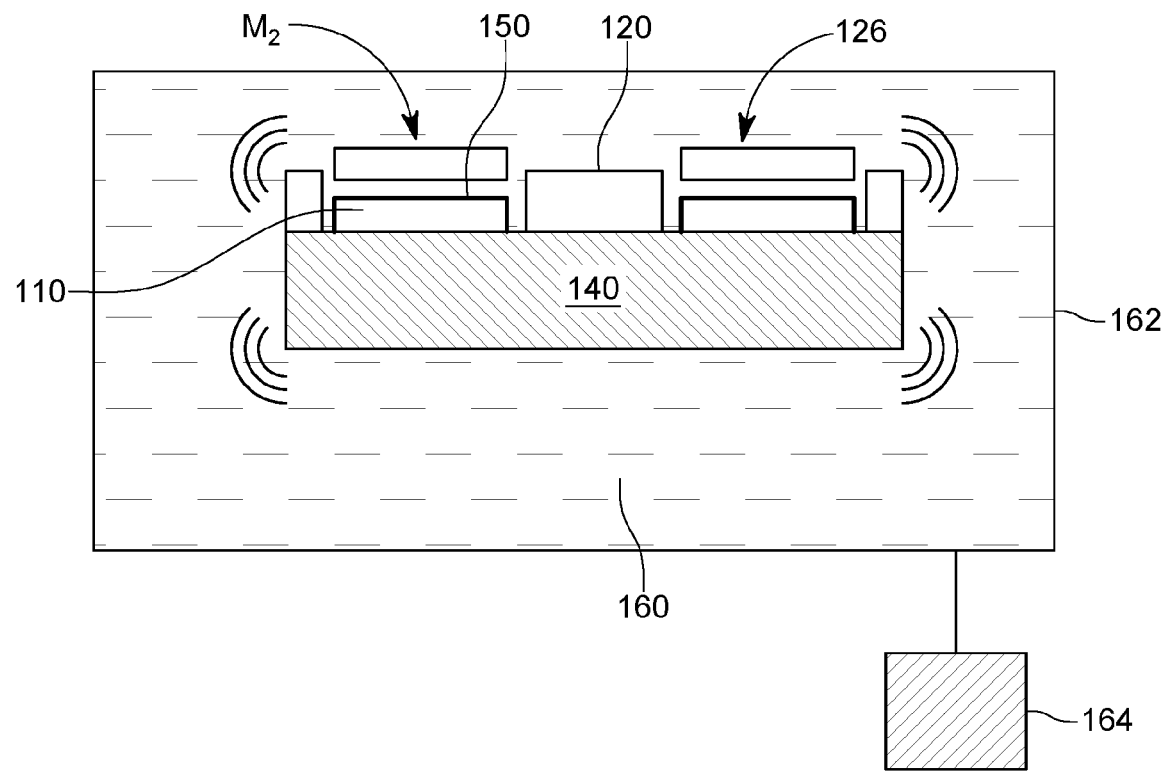

With regard to FIG. 3C, in all areas where the second layer M2 overlaps with the first electrode 110, the SAM treated surface of the first electrode 110 drastically reduces the adhesion between the material of the first electrode and the material of the second layer M2. Thus, when immersing in step 210 the substrate 140 in a liquid 160 (e.g., acetone or other liquids) contained in a container 162, as show in FIG. 3D, while gently shaking/agitating in step 212 the container 162, either through manual agitation or ultrasonication for a few minutes, or as long as it is required, makes the second layer M2 to be removed (spontaneously being lift-off) from all the areas where it overlaps the first electrode 110, but not from the areas where the second layer M2 directly contacts the substrate 140. Note that the step of agitation may also be implemented by directing a fluid jet over the second layer M2 to remove it from the areas where the SAM layer is present. The fluid may be a liquid or a gas, e.g., air. The jet needs to have enough speed to accomplish this task. However, if the fluid jet is directed over the second layer M2, there is no need to move/shake/agitate the substrate for removing the second layer M2 from the first M1 layer.

Figure 3E:
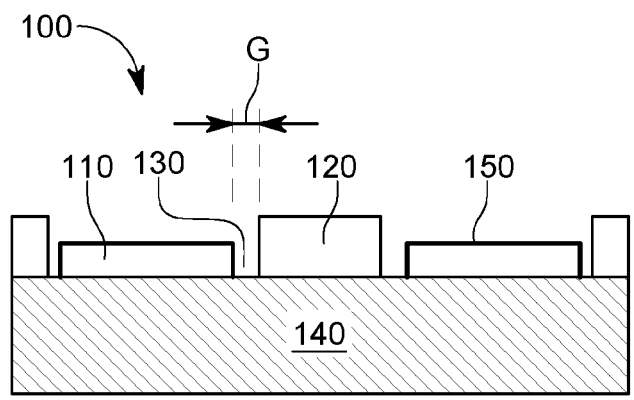

As a result of the agitation step 212 (which can be achieved with a motorized device 164), the second layer M2 is fractured along the boundary of the first electrode 110, and because of the low-energy adherence between the SAM layer 150 and the parts 126 of the second layer M2 that are in direct contact, these parts 126 are falling off the SAM layer 150. However, the other parts of the second layer M2, that are directly formed on the substrate 140, remained adhered to the substrate, and thus they form the second electrode 120. As the parts 126 of the second layer M2 are falling off the device 100, the nanogap 130 appears between the first electrode 110 and the second electrode 120, as shown in FIG. 3E. The nanogap 130 has a gap width G as previously shown in FIG. 1. The gap width G has been found to be 20 nm or less. This gap 130 is self-forming and can be used for depositing other materials to make a diode, transistor, sensor, integrated circuit, WEH devices, etc.

To remove the second layer M2 from the overlapping areas of the first electrode 110, several techniques are possible. These include the submersion of the substrate into a solvent bath (water, IPA, acetone amongst many other options) either with intermittent manual shaking for a duration of <1 h or without additional manual agitation over a prolonged period of time. Instead of manual agitation, in another embodiment, it is possible that the second layer M2 removal is initiated by ultrasonication for a shorter time frame (tenths of seconds to minutes). Another possibility without the usage of solvents is to expose the substrate to a pressurized gas stream (using compressed air, nitrogen, or other gases) that can remove the overlapping areas between the first electrode and the second metallic layer. Alternatively, an adhesive layer (glue, tape, etc.) is placed over the second layer M2, and then this layer is peeled-off, thereby taking away all weakly adhered M1/M2 overlapping regions, similar to a process described in [1]. However, this manual step described in [1] needs to be carried out manually, with great care. Variations in the peel-off rate and the pulling force can lead to process variations, depending on the operator. Eliminating this peel-off step by using self-forming nanogaps as described in the method illustrated in FIG. 2, especially step 212, increases the uniformity of the gap, removes operator-to-operator fluctuations, as well as saves material costs for special glues.

The nanogap 130 may be used, as discussed next, to receive one or more materials (semiconductor material or dielectric material). For this process, the SAM layer can be removed, for example, using a plasma treatment of less than 20 min, or an equivalent process, and a different SAM layer with a particular functionality (i.e., ability to change the electronic properties or chemistry of both or one of the electrodes) may be post-deposited inside the nanogap, for making a desired solid state device.

Figure 5A:
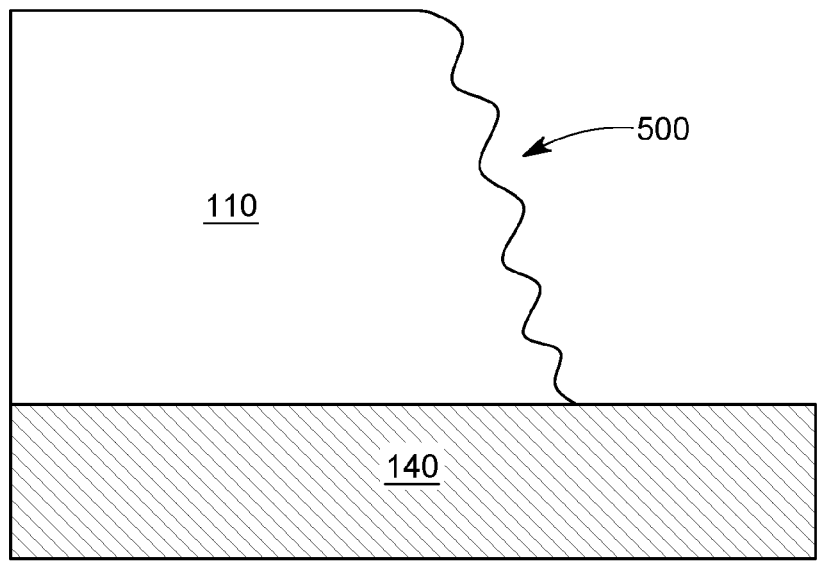
FIGS. 5A and 5B illustrate a profile of a border of a first electrode of the solid state device.
Figure 5B:
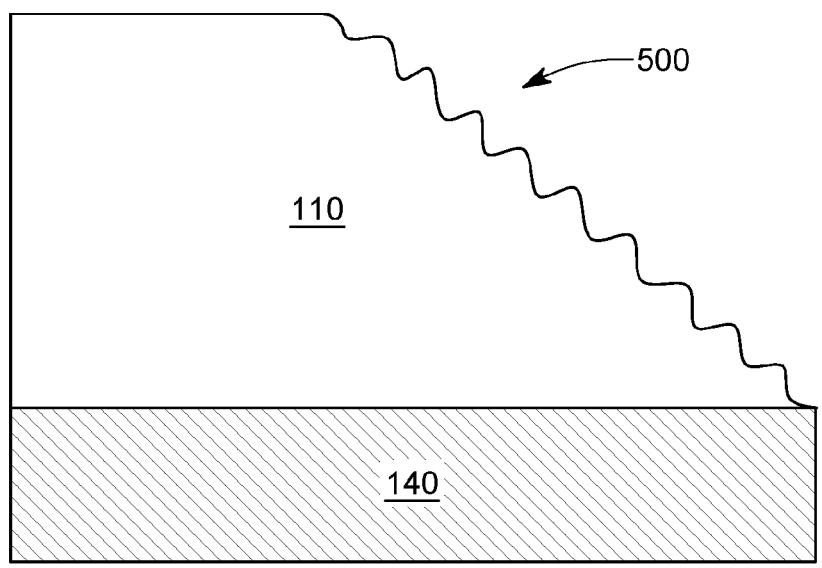

Various factors that may affect the nanogap fabrication process are now discussed. One such factor is the edge profile of the first electrode 110. Because the nanogap formation takes place around the lateral boundary line of the first electrode 110, this area appears to affect the process discussed with regard to FIG. 2. The height profile 500, from the substrate 140, of the first electrode 110 at this region can vary between a steep and sharp transition, as shown in FIG. 5A, to a more gradual one or even an undercut, as shown in FIG. 5B, depending on the technique employed to pattern the first layer M1 to obtain the first electrode 110. A sharp transition as shown in FIG. 5A is generally preferred to create a nanogap of smallest dimensions, but it may not be necessary, depending on the application envisioned.

The deposition rate of the materials making the first layer M1 and the second layer M2 also play a role. It is known that the deposition rate during a gas phase deposition process influences certain properties of the final film. This applies to the average grain size within the metal film and to the surface roughness (root-mean-square roughness, rms). In the case of aluminum, for example, the formed films tend to show a reduced grain size and roughness values at higher deposition rates. The grain size in both the first and second layers influences the nanogap formation process. For the first metallic layer M1, the grains define the lateral boundary, meaning that smaller grain sizes lead to a generally preferred more uniform outline, whereas larger grains result in more irregularity. Because it is the second metallic layer that fractures during the gap formation process, its average grain size also plays a role, as fractures tend to occur along grain boundaries which constitute structurally weaker parts of the layer. Additionally, the adhesion of a deposited layer to the substrate material can change in magnitude, depending on the deposition rate and the nature of materials employed.

Figure 6A:
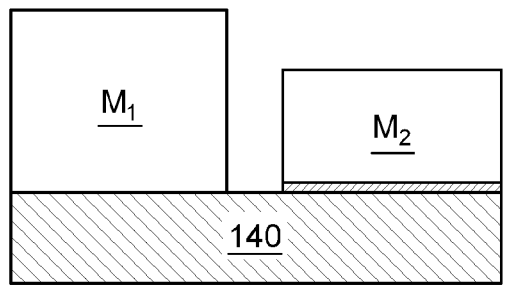
FIGS. 6A to 6C illustrate various possible combinations of thicknesses for first and second electrodes of the solid state device.
Figure 6A:
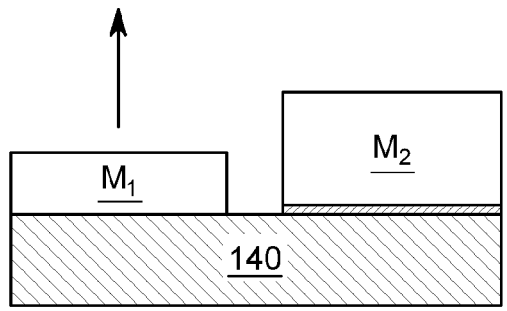
Figure 6B:
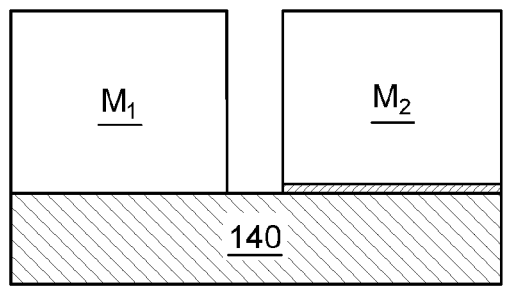
Figure 6B:
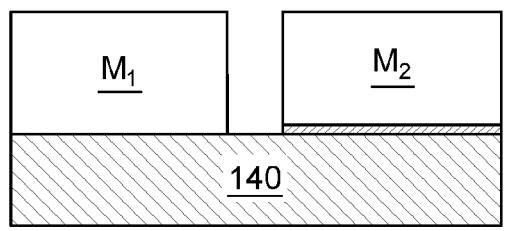
Figure 6B:
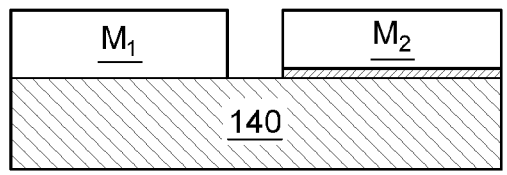
Figure 6C:
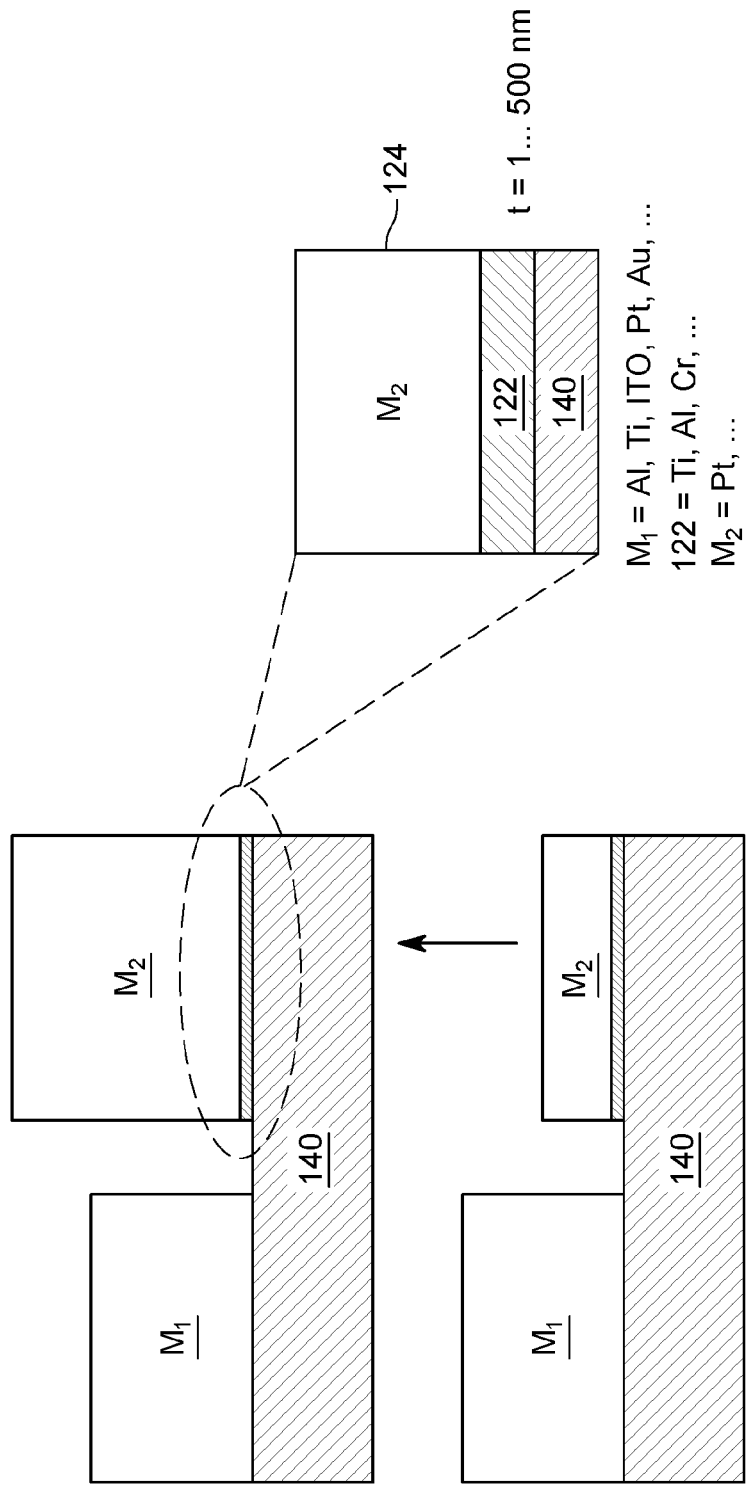

The thicknesses of the first layer M1 and the second layer M2 also influence the gap formation process. The dimensions of the self-forming nanogap may be influenced by the layer thickness of both metals involved. This applies for cases where both metals in the first and second layers M1 and M2 are of equal thickness, which can be varied from thin to thick, within the range of approximately 10 to 500 nm. Similarly, variations of the relative thicknesses between the first layer M1 and the possible interlayer 122 (formed between the substrate 140 and the second metallic layer M2) and the second layer M2 can have an effect on the final gap size. In this regard, FIG. 6A shows possible implementations of the device 100, in which the thickness of the second metallic layer M2 is constant, while a thickness of the first metallic layer M1 can vary from less than a thickness of the second metallic layer M2 to more than the thickness of the second layer M2. FIG. 6B shows the thicknesses of both layers M1 and M2 being equal, but having different values, and FIG. 6C shows possible variations of the thickness of the second metallic layer M2 relative to the first metallic layer M1. FIG. 6C also illustrates various materials that can be used for these layers.

Figure 7A:
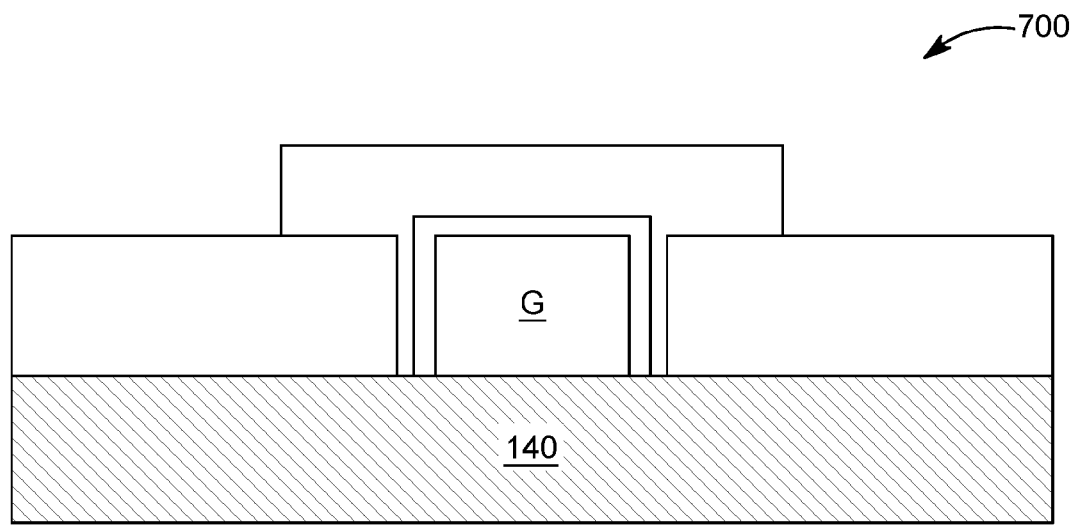
FIGS. 7A and 7B illustrate various transistors formed with the self-forming nanogap method.
Figure 7B:
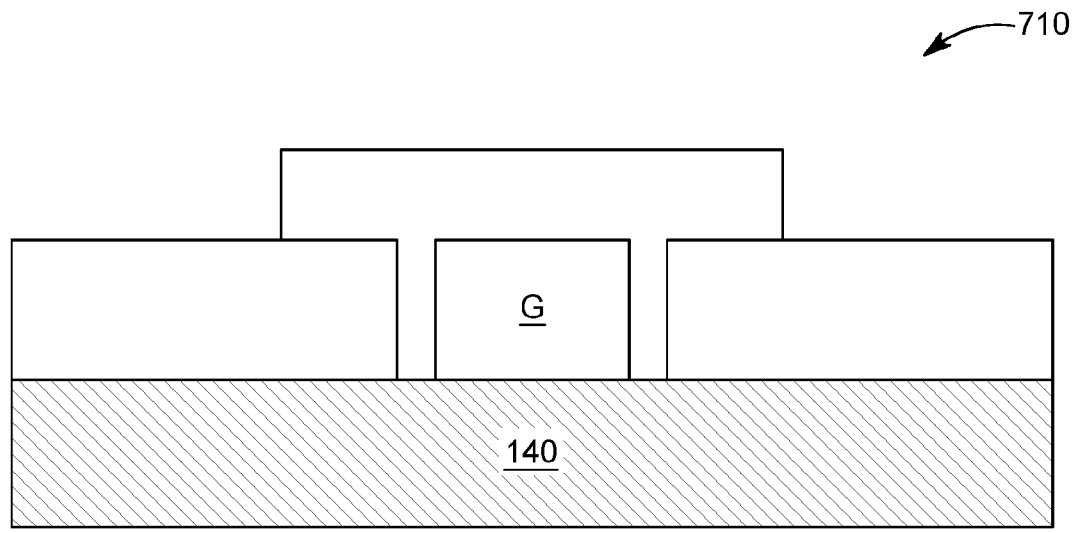
Figure 8A:
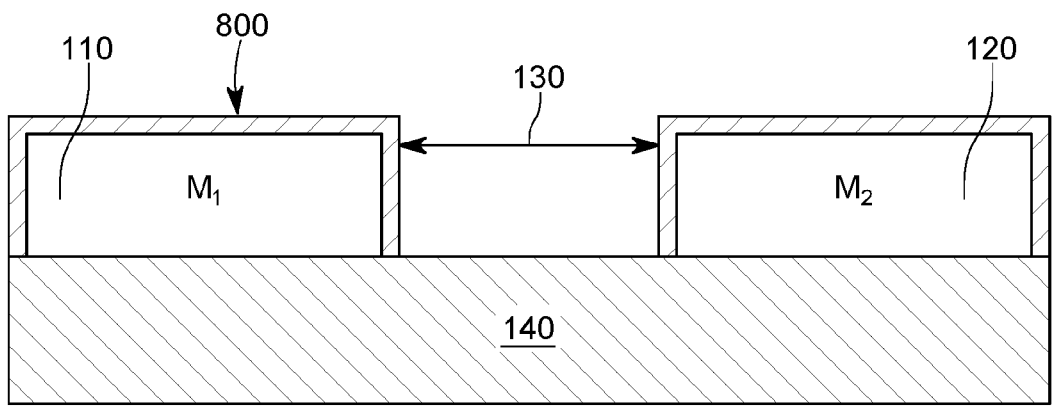
FIGS. 8A to 8F illustrate various stages of forming a transistor with the self-forming nanogap method.
Figure 8B:
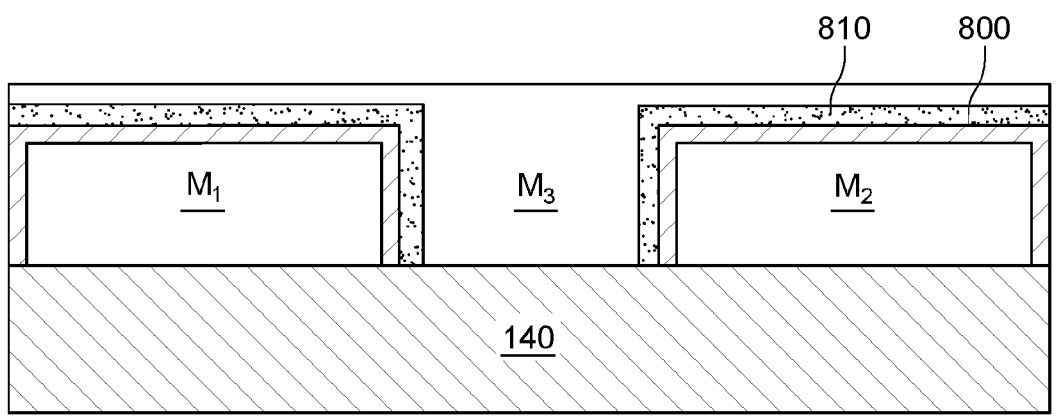

A first self-forming nanogap solid state device is now discussed. This device may be a TFT transistor 700 as shown in FIG. 7A or a Schottky gated TFT transistor 710, as shown in FIG. 7B. A method for manufacturing such solid state devices is discussed with regard to FIGS. 8A to 8F. FIG. 8A shows a substrate 140 on which first and second electrodes 110 and 120 have been formed with a nanogap 130 in between them, based on the method discussed above with regard to FIG. 2. The two electrodes 110 and 120 are SAM functionalized with a SAM layer 800, which may be the same or different from the SAM layer 150. Note that for the embodiment illustrated in FIG. 8B, the SAM layer 800 is formed after the formation of the gap 130, so that the SAM layer 800 extends inside the gap, along the side parts of the first and second electrodes 110 and 120. Note that the SAM layer is not formed directly on the substrate 140 due to the properties of the substrate, as discussed above. Also, the SAM layer does not fill the nanogap. Then, as shown in FIG. 8B, an interlayer 810 is formed over the SAM layer 800 and the substrate 140, followed by the formation of another metallic layer M3, to cover an entirety of the interlayer 810. The interlayer 810 may be made of similar materials as the interlayer 122 previously discussed.

Figure 8C:
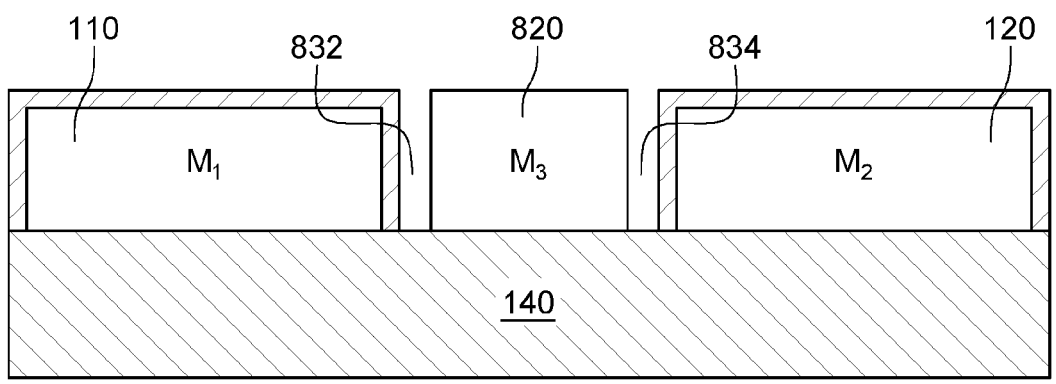

Then, the device shown in FIG. 8B is placed in a liquid (for example, step 210 in FIG. 2) and agitated (see step 212 in FIG. 2) so that the interlayer 810 and the third metallic layer M3 that are in direct contact with the SAM layer 800 fall out, while a portion of the third metallic layer M3 that is directly formed on the substrate 140 remains attached to the substrate 140, within the gap 130, to form the third electrode 820, as shown in FIG. 8C. In other words, the method discussed above with regard to FIG. 2 is applied to form additional first and second nanogaps 832 and 834, between the third electrode 820 and the adjacent first and second electrodes 110 and 120, as illustrated in FIG. 8C.

Figure 8D:
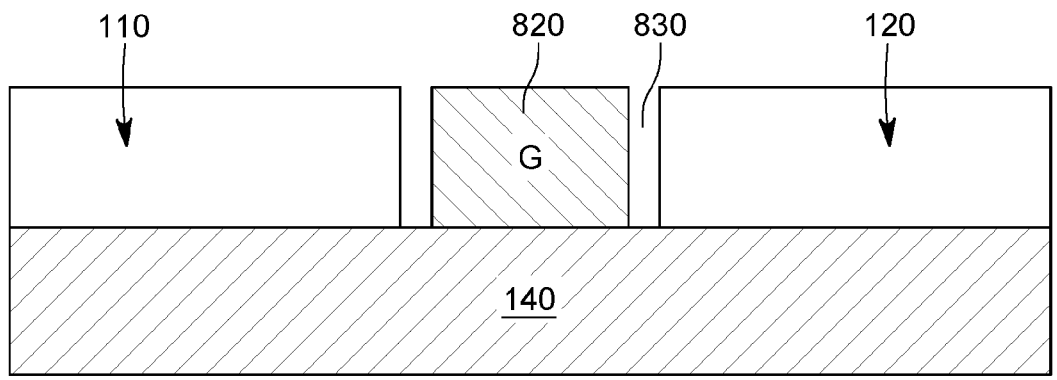
Figure 8E:
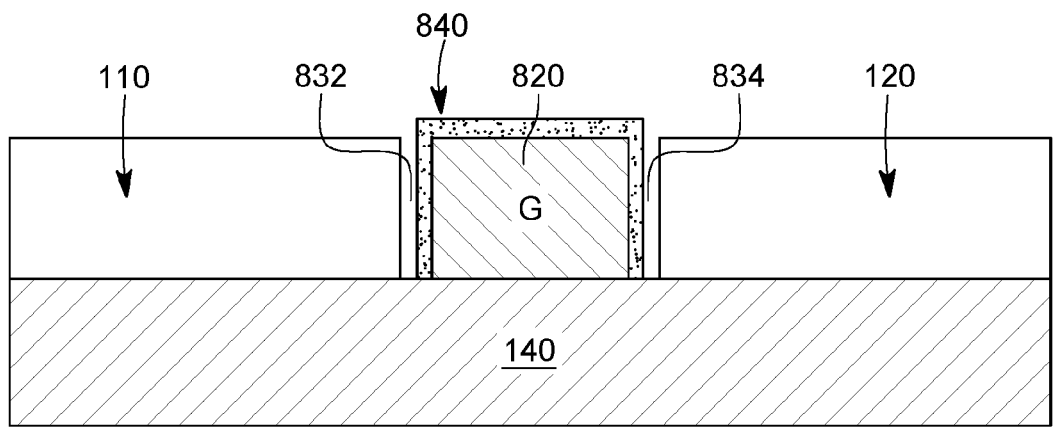
Figure 8F:
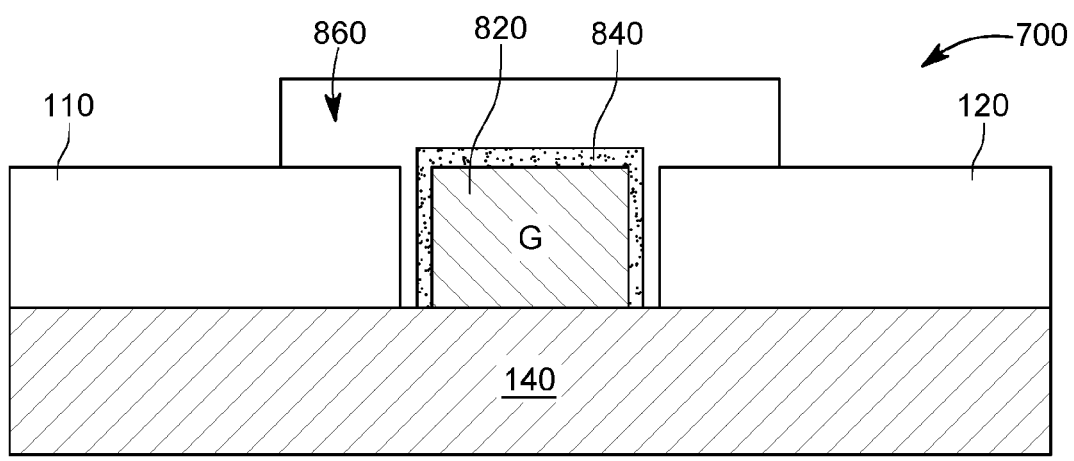

Next the SAM layer 800 may be removed, as shown in FIG. 8D, using for example UV/Ozone or plasma treatment or any other known method. A dielectric layer 840 may then be formed around the third electrode 820, inside the additional gaps 832 and 834, using any traditional method, as shown in FIG. 8E. For example, the dielectric deposition may include either the formation of a native oxide on the electrode 820 via oxidization and/or the deposition of a SAM using self-assembly (which does not require any manual alignment step). The formation of the dielectric material 840 inside the additional nanogaps 832 and/or 834 does not mean that these gaps are filled with the dielectric material. Next, a semiconductor material is deposited in the remaining parts of the additional gaps 832 and 834 and over the dielectric layer 840, to form a semiconductor layer 860, as illustrated in FIG. 8F. Note that both the dielectric layer 840 and the semiconductor layer 860 are formed inside the gaps 830.

In this way, the TFT transistor 700 is obtained, where the first and second electrodes 110 and 120 play the roles of the source and drain of the transistor, and the third electrode 820 plays the role of the gate of the transistor. The semiconductor layer 860 acts as the channel between the source and the drain, and the electric charge flow through the channel is controlled by the gate 820, through the dielectric material 840.

Figure 9:
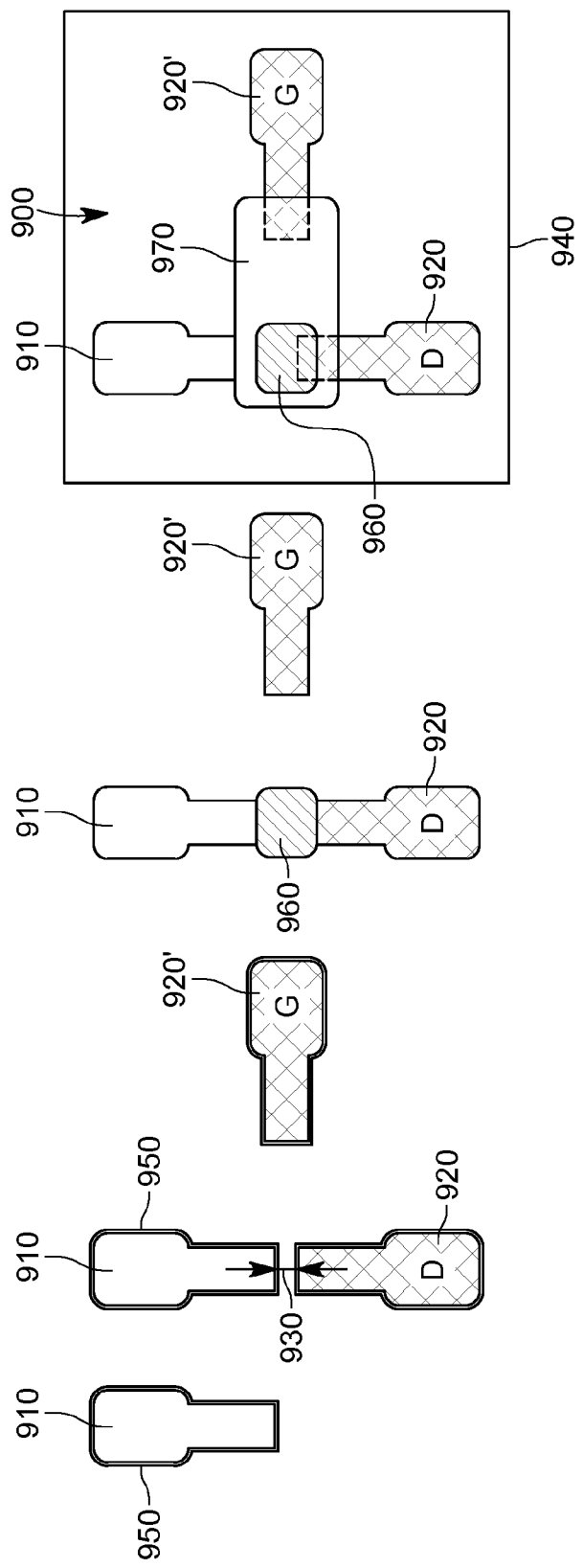
FIG. 9 illustrates an electrolyte-gated transistor and is formed with the self-forming nanogap method.

In another embodiment, as illustrated in FIG. 9, it is possible to form an electrolyte gated transistor 900 based on the self-forming nanogaps method. Such a transistor is manufactured by starting with a first electrode 910, which is formed on a substrate 940. A SAM layer 950 is formed around and on top of the first electrode 910. The second electrode 920 is formed next to the first electrode 910, similar to the method discussed in FIG. 2, and the entire device is placed in a liquid and agitated inside a container, to form the nanogap 930, between the first and second electrodes 910 and 920. A third electrode 920', which will act as the gate of the transistor, is formed on a side of the first and second electrodes, so that a longitudinal axis of the third electrode is facing the nanogap 930 formed between the first and second electrodes 910 and 920. Note that the longitudinal axis of the third electrode may be arranged in a different direction. A semiconductor material 960 is formed in the nanogap 930 and then an electrolyte 970 is deposited over the semiconducting material 960, and partially over the first electrode 910, the second electrode 920, and the third electrode 930, to complete the electrolyte gated transistor 900. Note that the second electrode may be formed to include a first layer of Ti and a second layer of Pt.

Figure 10A:
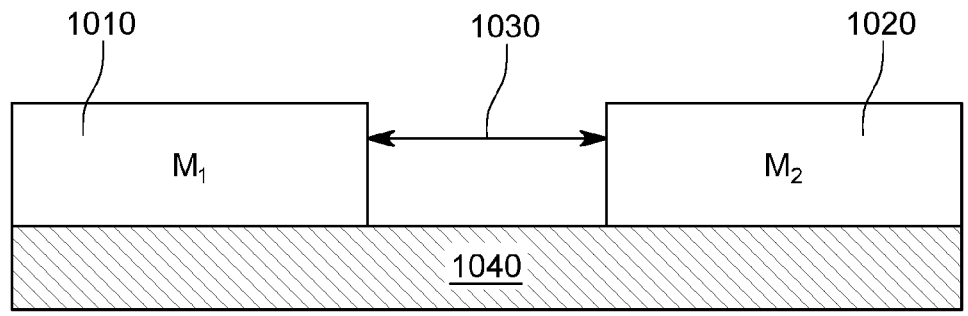
FIGS. 10A to 10C illustrate a diode formed with the self-forming nanogap method.
Figure 10B:
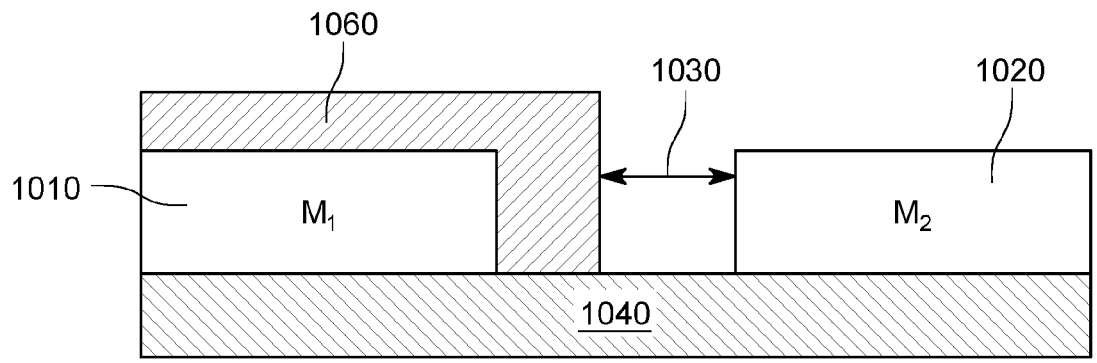
Figure 10C:
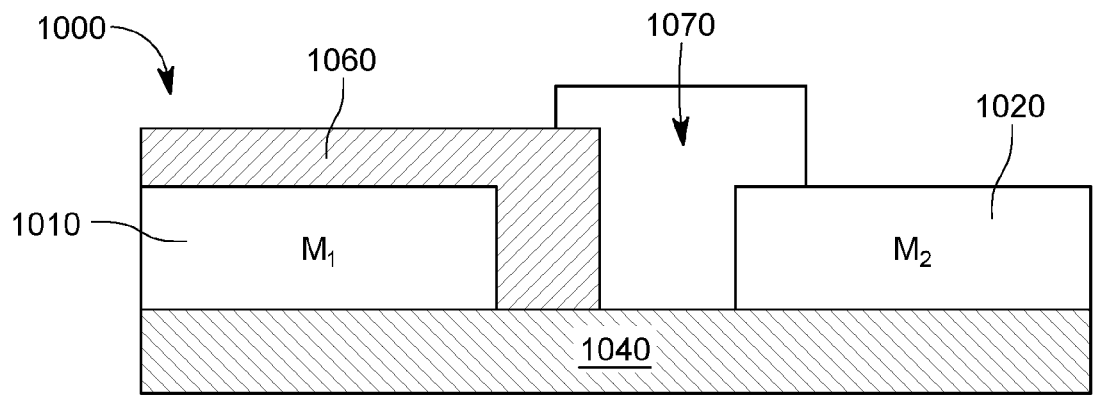

While the previous embodiments discussed the formation of various transistors based on the self-forming nanogap technique of FIG. 2, FIGS. 10A to 10O illustrate the formation of a pn-diode with the same technique. FIG. 10A shows the formation of the first electrode 1010 and the second electrode 1020, with a nanogap 1030 between the electrodes, similar to the method discussed with regard to FIG. 2. In one embodiment, the first metallic layer M1 includes Ti and the second metallic layer M2 includes Pt. FIG. 10B shows that the surface of the first electrode 1010 has been oxidized to form a layer of $TiO_2$ 1060, which is n-type. Note that part of the n-type layer 1060 extends inside the nanogap 1030, along a side of the first electrode 1010, but is not in contact with second electrode 1020. Then, a p-type semiconductor 1070 is formed in the remaining part of the nanogap 1030, as shown in FIG. 10O, to obtain the pn-type diode 1000.

It is also possible to form the pn-diode by using Ni and/or Cu for the first metallic layer M1 and Pt for the second metallic layer M2. If this is the case, FIG. 10B shows that the surface of the first electrode 1010 has been oxidized to form a layer of Cu or Ni oxide 1060, which is p-type. Note that part of the p-type layer 1060 extends inside the nanogap 1030. Then, an n-type semiconductor 1070 is formed in the remaining part of the nanogap 1030, as shown in FIG. 10O, to obtain the pn-type diode 1000.

Figure 11A:
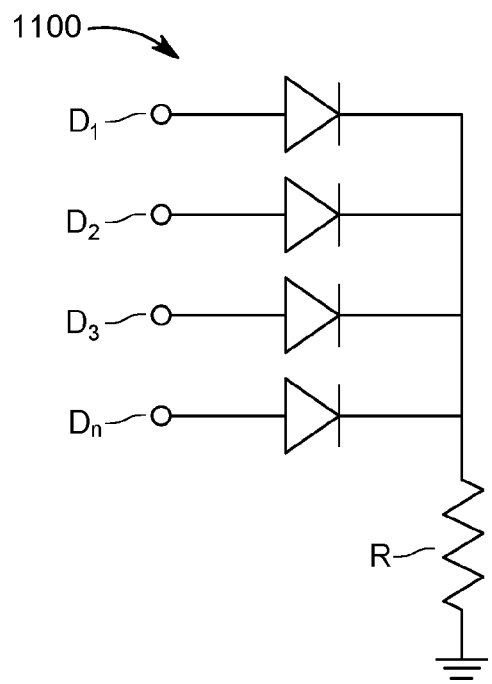
FIGS. 11A to 11G illustrate the formation of diode logic gates using the self-forming nanogap method.
Figure 11B:
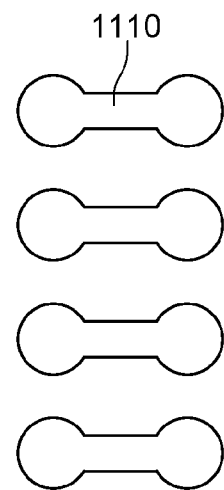
Figure 11C:
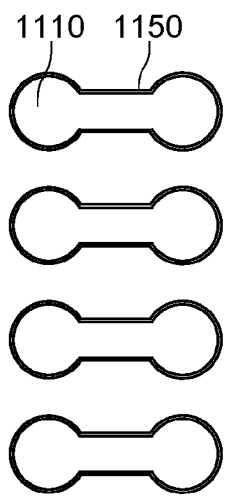
Figure 11D:
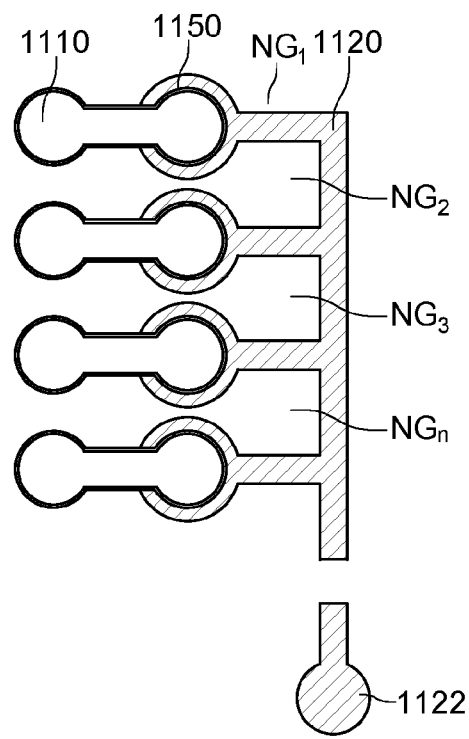
Figure 11E:
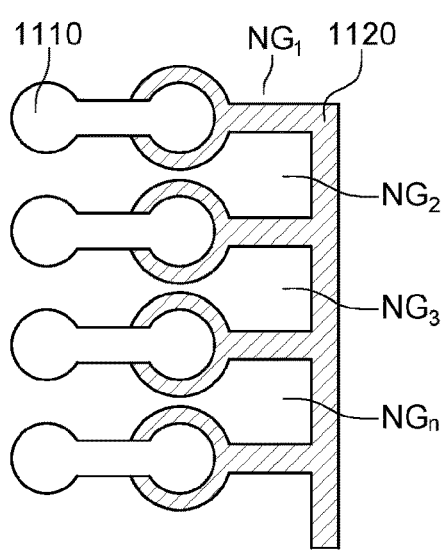
Figure 11F:
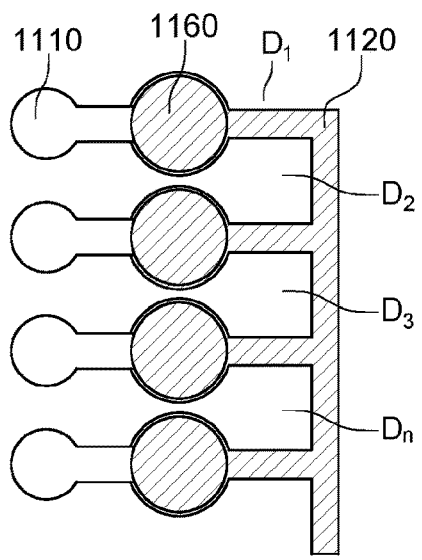
Figure 11G:
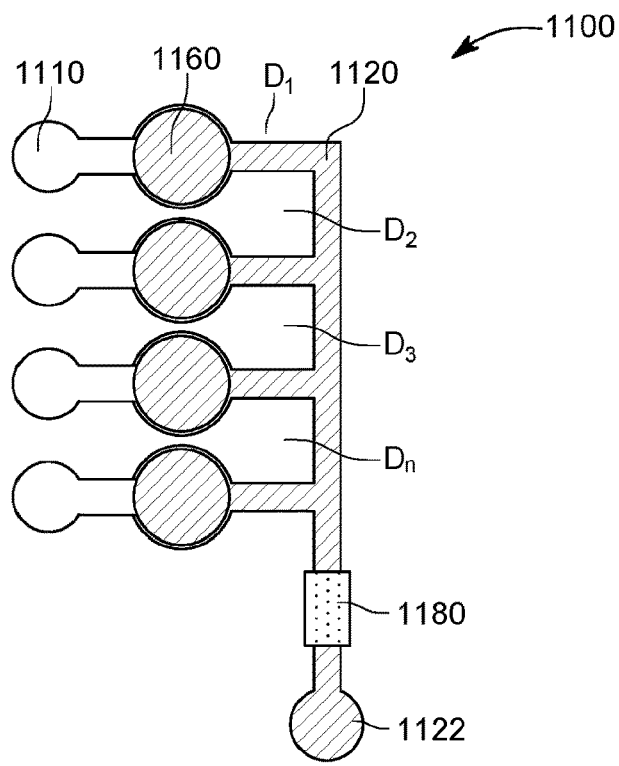

The novel self-forming nanogap technique illustrated in FIG. 2 may also be used to build monolithic circuits, for example, diode OR/AND gate, memory arrays, Schottky diodes, Schottky gated transistors, interdigitated back contacts for photovoltaic panels, capacitors, etc. Only some of these elements are illustrated herein. FIG. 11A schematically illustrates a diode logic gates circuit 1100 that can be implemented with the self-forming nanogap technique discussed above. FIG. 11B shows the formation of plural first electrodes 1110 on a substrate (not shown), FIG. 11O shows the formation of the SAM layer 1150 around each electrode of the plurality of the first electrodes 1100. FIG. 11D shows the formation of a combined electrode 1120, next to the plurality of the first electrodes, so that there are as many second electrode ends as the number of the first electrodes. FIG. 11D also shows the formation of plural nanogaps NG1 to NGn, using the self-forming nanogap technique, and also the formation of a ground electrode 1122, next to the second electrodes. In this embodiment, an end of each of the first electrodes is formed to have a rounded shape, and a corresponding end of the second electrodes is formed to extend around the rounded shape of the first electrodes. FIG. 11E shows the device after the SAM layer 1150 has been removed. FIG. 11F shows the formation of a semiconductor material 1160 in each nanogap, between the plurality of first electrodes 1110 and the second electrodes 1120, so that plural diodes D1 to Dn are obtained. FIG. 11G shows a resistor 1180 deposition between a common part of the plural second electrodes 1120 and the ground electrode 1122, to complete the n diodes device 1100. Note that any number of diodes may be formed in this way on a same substrate, each diode having a nanogap made with the method illustrated in FIG. 2, which means that this process can be implemented in an automated way, is scalable, and economical. Also note that each first electrode 1110 is not electrically connected to another first electrode while all the second electrodes 1120 are electrically connected to each other.

Figure 12A:
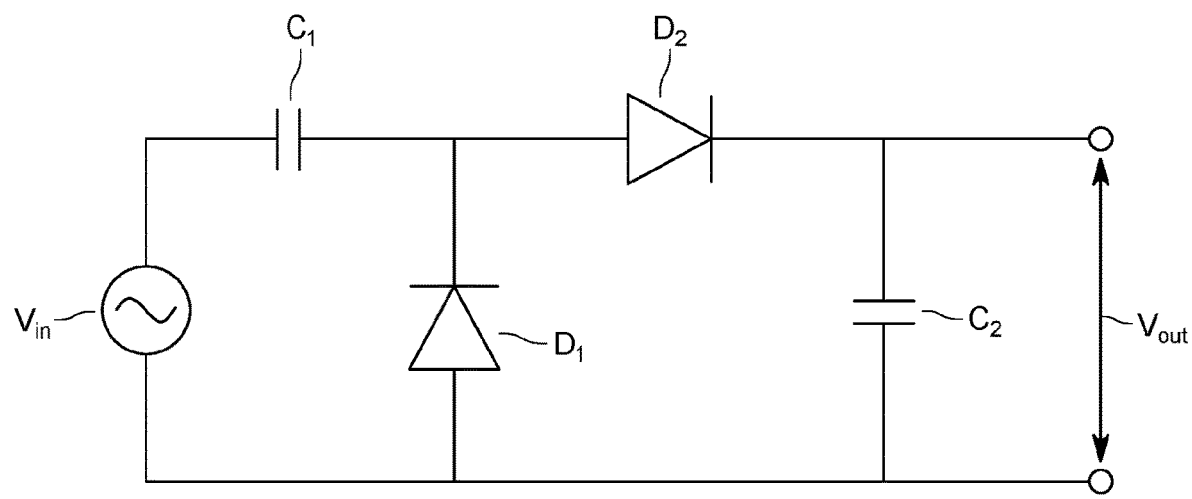
FIGS. 12A to 12D illustrate the formation of a voltage doubler circuit with the self-forming nanogap method.
Figure 12B:
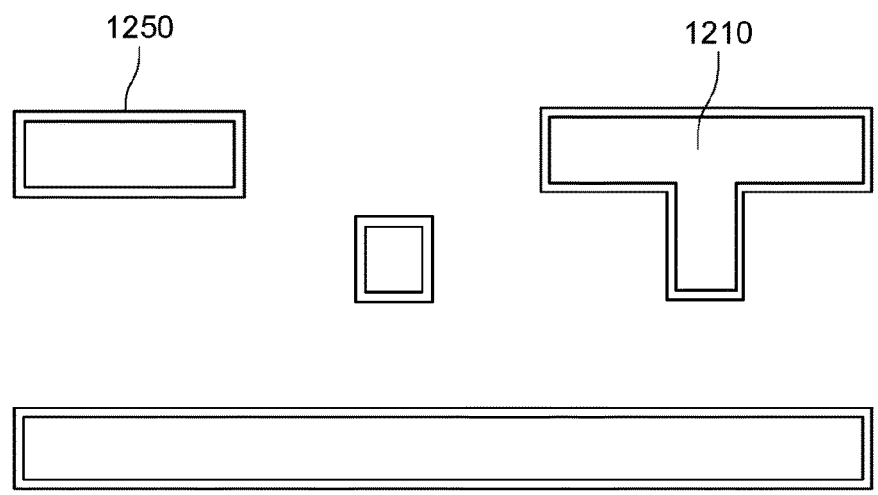
Figure 12C:
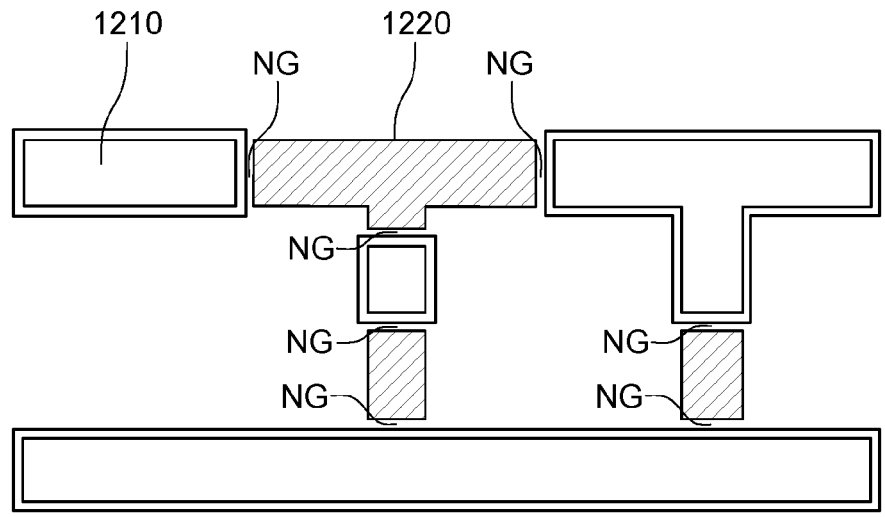
Figure 12D:
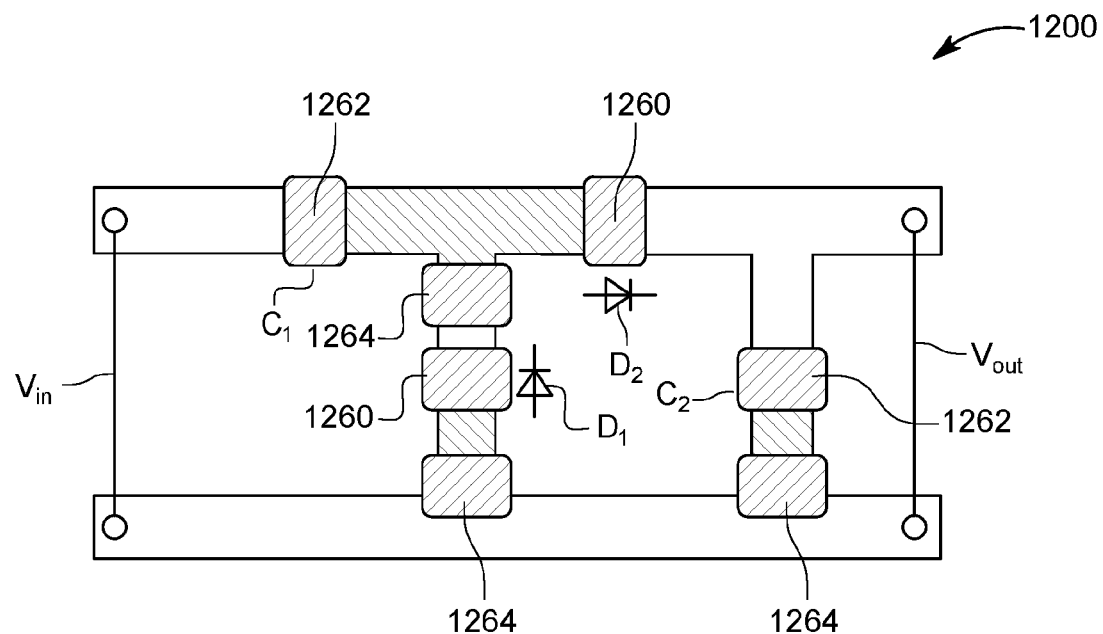

FIGS. 12A to 12F show another embodiment in which the technique of self-forming nanogaps of FIG. 2 is used to make a voltage doubler (Greinacher) circuit 1200. The equivalent electronic circuit diagram is shown in FIG. 12A, and this circuit includes two capacitors C1 and C2 and two diodes D1 and D2. FIG. 12B shows the start of forming such a circuit, which includes plural first electrodes 1210 formed on a substrate (not shown), and the SAM layer 1250 formed around and on top each of the plural first electrodes 1210. FIG. 12C shows the formation of the second electrodes 1220, between corresponding first electrodes, and also the formation of plural nanogaps NG between various first and second electrodes, using the technique of FIG. 2. After the removal of the SAM layer 1250, two of the formed plural nanogaps are selectively filled with a semiconductor material 1260 to form diodes D1 and D2, two of the formed plural nanogaps are selectively filled with a dielectric material 1262 to form capacitors C1 and C2, and two of the formed plural nanogaps are selectively filled with a conductor material 1264 to short selected first and second electrodes, as illustrated in FIG. 12D. Then, an input voltage Vin may be applied between two electrodes to double the voltage at an output Vout of the circuit 1200. Note that a voltage doubler is only one possible implementation of the nanogap formation method of FIG. 2. In fact, many other implementations may be achieved for a voltage multiplier, and other similar devices. Another implementation of the method of FIG. 2 may be for a memory array, where a material that shows switching properties (e.g., phase change materials) may be formed in the nanogaps, to fabricate the memory.

The various solid state devices discussed above may need one or more steps of annealing, for changing or altering the properties of one or more of the deposited materials. More specifically, an active material such as a semiconductor or dielectric can be inserted into the nanogap to transform the pair of a/symmetric electrodes into functional devices. This active material can be deposited on top of the nanogaps following the self-forming adhesion lithography process or alternatively, be already present as a layer on the surface of the substrate at the start of the procedure. The deposited material often requires additional annealing, either to improve properties to a sufficient level or to chemically convert a precursor into the final material. Conventional thermal annealing procedures are time consuming (the timeframe for such a process is in the range of minutes to hours) and expose the whole substrate to the same high temperature, therefore making it difficult to employ temperature sensitive substrates, such as plastics, paper, etc.

According to an embodiment, a method for making such solid state devices based on self-forming nanogaps is replacing the conventional thermal annealing with a photonic curing step. This novel procedure is sending out short, intense, pulses of white, or laser, light onto the substrate. In this description, the white light is understood to include any wavelength between 200 and 1200 nm. The pulse of light noted above may include the entire range of 200 to 1200 nm, any subset of this range, or a given wavelength in this range. The exposed areas will heat up according to their absorption properties, leaving the transparent materials cool, but rapidly heating up the opaque materials. The emitted light pulses can last from nanoseconds to several seconds and can be repeated for a given number of times to achieve the desired material properties.

In case of the metal nanogap structures, the metallic electrodes can absorb the light and the resulting heat is channeled into the nanogap. Because the temperature inside the gap can rapidly rise to very high values (between 100-1500° C.), depending of the metal used for the electrodes, the light intensity, pulse duration, etc., the precursor solution can efficiently be converted to the final active material without heating the substrate. In other words, because the distance between the electrodes is so small (nanometers), the heat from the electrodes would quickly propagate to the nanogap, but not to the substrate. Also, because the size of the nanogap is so small, only a small amount of heat is necessary to be transferred to the electrodes to heat up the material placed in the nanogap.

The inventors have tested this capability of the self-forming nanogap process with a combination of self-forming nanogap electrodes consisting of Al—Pt, a solution processed indium gallium zinc oxide (IGZO) precursor, as well as photonic curing, and it was shown that this combination can lead to high performance radio-frequency (RF) diodes with intrinsic cut-off frequencies of over 100 GHz (higher than any other RF diode reported to date based on solution processed semiconductor). While IGZO as well as the nanogap combination of Al—Pt were chosen as a specific working example, virtually any precursor formulation that typically requires thermal annealing can be used in combination with this procedure. Similarly, because the nanoscale distance between the metal electrodes achieves this effective thermal coupling of the energy provided by the photonic processing, any combination of metals used for the electrodes will be effective in this way.

For the specific case of RF nanogap diodes based on photonic curing of IGZO precursor, the following process has been used: separate solutions of Indium nitrate hydrate, Gallium nitrate hydrate and Zinc nitrate hexa-hydrate were prepared in 2-methoxyethanol as the solvent, with concentrations of 0.1 M each. The IGZO precursor was then created by mixing those individual solutions in a ratio of 5:1:3 (In:Ga:Zn) by volume. The IGZO precursor was filtered with a 0.2 µm PTFE filter and then spin coated over the nanogap devices inside a nitrogen filled glovebox and dried at 130° C. for 10 minutes. The photonic curing was then carried out using a tool with a pulse energy of 5.11 J cm$^{-2}$, a pulse length of 500 µs and 20 repeated pulses with a fire rate of 1.2 Hz. Variations in this process' parameters also yield functional devices, whereas those mentioned here resulted in optimum (higher cut-off frequency) diode performance.

In one specific implementation, which is not intended to narrow or restrict the scope of the invention, a diode 1300 type device has the substrate 1340 and a third electrode 1322 made of a transparent material (for example, ITO) so that a light beam 1392 emitted by a light source 1390, is able to pass them and to irradiate the photoactive dielectric or semiconductor material 1360, to change its properties as discussed above. Note that in this case, the top portions of the first electrode 1310, the second electrode 1320, and the photoactive material 1360 are covered with a passivation/encapsulation layer 1380, which is opaque to light. Thus, the transparent substrate and third electrode act as a waveguide to transport the light to the photoactive material. The light source 1390 may be a laser device.

Figure 13A:
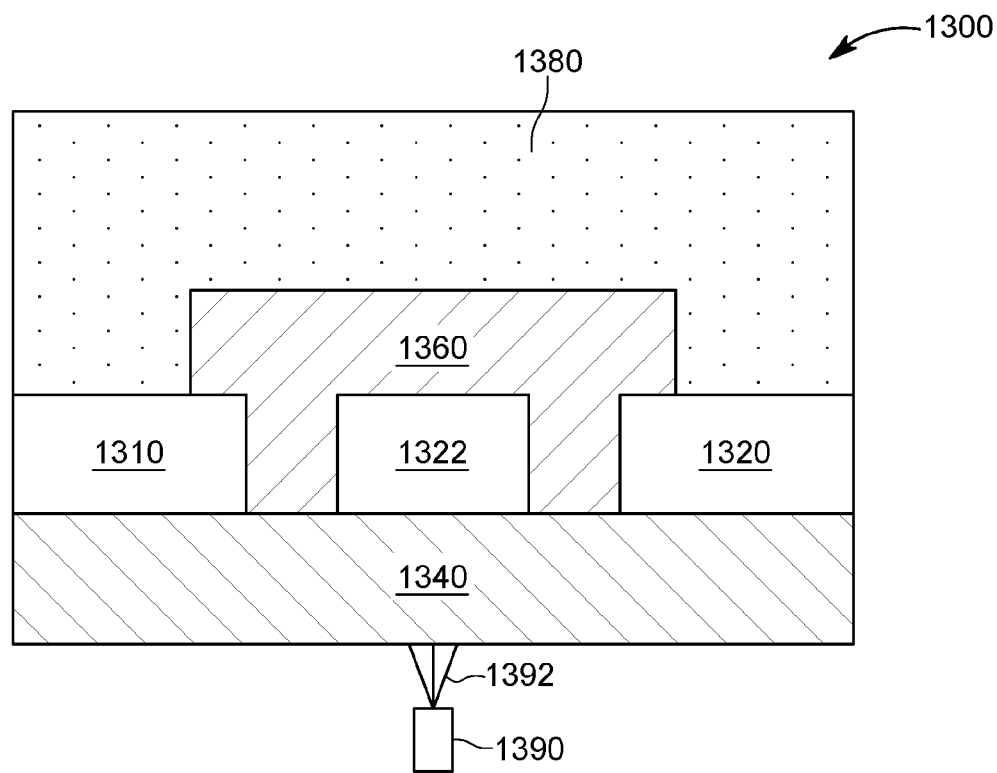
FIGS. 13A and 13B illustrate a process of directly coupling light to a nanogap of a semiconductor device formed with the self-forming nanogap method.
Figure 13B:
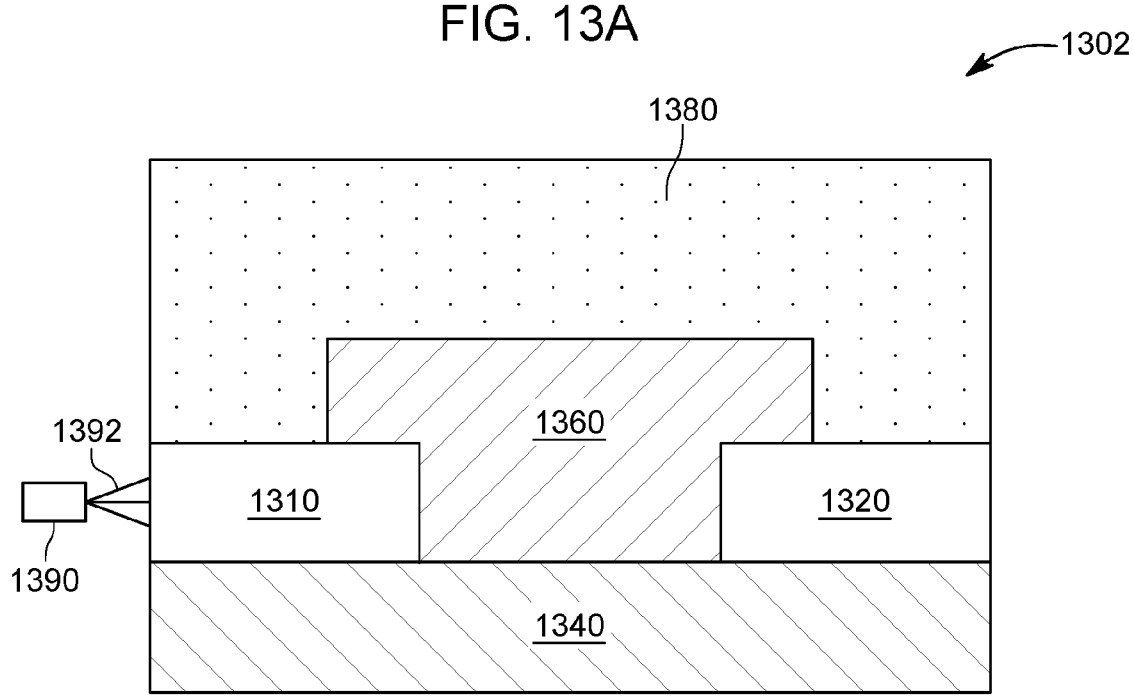

In a similar implementation, a diode 1302 has the first electrode 1310, the second electrode 1320, and the photoactive semiconductor 1360 covered with the opaque material 1380. However, in this case the substrate 1340 is not made of a transparent material, but only one of the first and second electrodes. In this case, the light source 1390 is placed on a side of the device, as shown in FIG. 13B, and not at the bottom of the device as shown in FIG. 13A, for emitting the light beam 1392 to the photoactive semiconductor 1360, for rapid photonic processing, through the first electrode 1310.

A couple of differences between the aforementioned methods and known processing techniques are now discussed. Currently, the photolithography is the industrial standard used in the formation of conductive materials that can be spaced apart with a gap around sub-300 nm. Unfortunately, the gap resolution in this technique is limited by the wavelength of the light. Alternatively, there are other lithography-based techniques described in the literature. Among them, electron-beam (e-beam) lithography is another conventional method that can be used to achieve nanogaps less than 20 nm. However, the application of the e-beam is restricted in terms of substrate materials and size, and by the use of symmetric electrode materials, i.e., this method cannot easily be used to form nanogaps between different metals/materials. Additionally, the e-beam lithography is not scalable to large area applications such as industrial wafer sizes (larger than 4" diameter) due to their technical limitations and associated low throughput.

Atomic layer lithography begins with the deposition of an $Al_2O_3$ layer on top of the patterned metal layer, followed by the deposition of the second metal layer. Although angstrom-scale lateral resolution can be realized with this method, scaling to large-area and high-yield are some of the drawbacks associated with this method. Other lithography based techniques, such as nanoimprint lithography or nanospheres lithography are also used for realizing nanogap features. However, all these techniques are suffering from either resolution or scalability issues.

Apart from lithography, a focused electron beam can be used in different techniques such as e-beam induced deposition and e-beam induced sputtering and migration for the production of sub-10 nm features. E-beam induced deposition is based on growing suspended carbon nanotubes that are used as templates for metallic electrodes with the precise control of the gap between them. On the other hand, e-beam induced sputtering and migration uses the high-electron beam radiation to form a nanoscale gap on the metallic nanowires. However, both techniques are limited in terms of electrode choice and scalability.

Instead of focused electron beams, focused ion beams can also be used for nanogap fabrication. A recent technique for fabricating nanogaps proposes breaking the metallic junctions with Focused Ion Beam (FIB) Milling. Unlike the process discussed herein, this method requires complex fabrication procedures such as Reactive Ion Etching and FIB, which are not compatible with wafer size applications and flexible substrates. In addition, these methods work only with symmetric electrode materials. Similarly, instead of milling, the FIB induced deposition technique uses the secondary electrons to improve the fabrication resolution. However, this technique also suffers from scalability and issues with asymmetric metal electrodes.

In the literature, there are few other techniques described for nanogap electrode formation such as mechanical break junctions, metal oxidation, scanning probe lithography, or nanostructured masks. The mechanical break junction technique relies on the generation of nano-fractures on a metal nanowire using the bending of the flexible substrate. This method is not suitable for large-scale applications as well as processing of asymmetric metals or rigid substrates. Another alternative technique in forming nanogaps uses oxidation of a sacrificial metal to create a spontaneous shadow mask. Unlike the novel process of FIG. 2 in the present application, etching of this sacrificial layer is limiting the electrode material and substrate choice for this technique. Scanning probe lithography uses the sub-nanometer scale resolution of the scanning probe technique to either scratch a metallic surface, precisely position the molecules from a coated Atomic Force Microscopy tip or synthesize and assemble metal nanostructures. However, this technique is limited in terms of electrode and substrate materials as well as large area applications. Nanostructured mask technique uses nanowires, nanotubes or the suspended edges as natural masks. Although these techniques can be used for single device applications, their large-scale applications are not realizable due to the precise positioning of these materials to the designated places.

Figure 14:
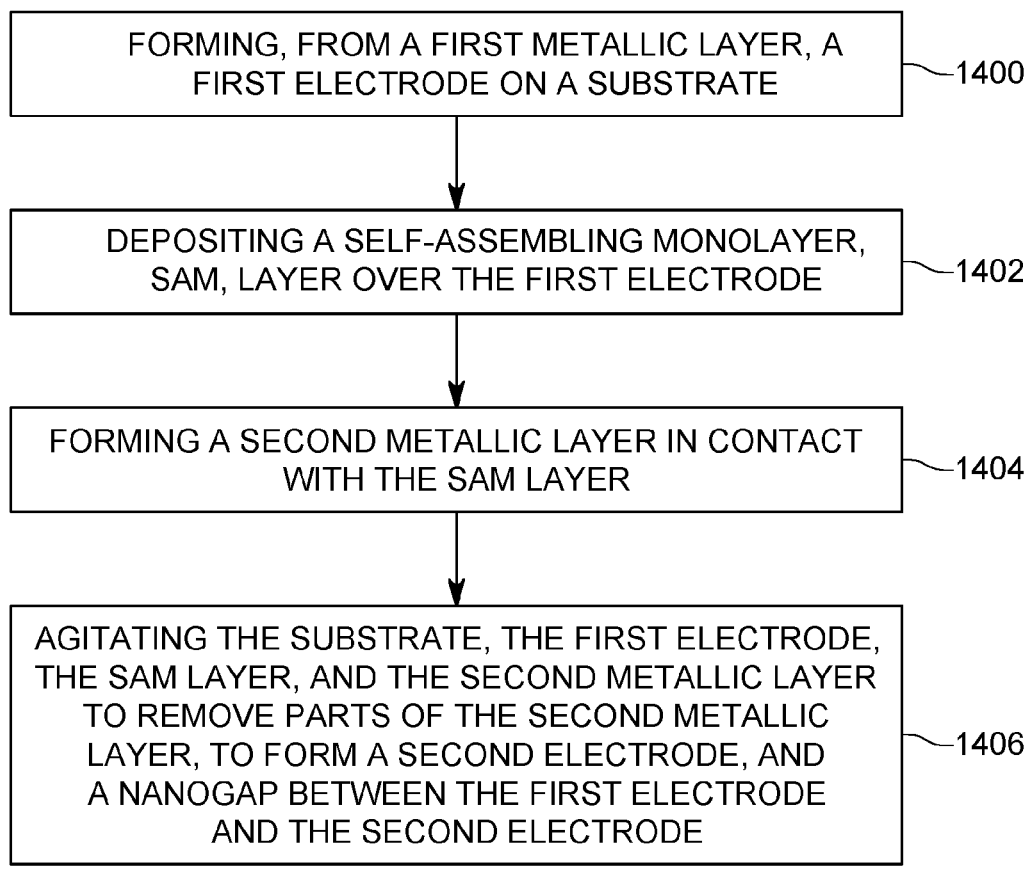
FIG. 14 is a flowchart of a method for making a solid state device with a self-forming nanogap method.

A method for making a solid state device with a self-forming nanogap is now discussed with regard to FIG. 14. The method includes a step 1400 of forming, from a first metallic layer (M1), a first electrode on a substrate, a step 1402 of depositing a self-assembling monolayer, SAM, layer over the first electrode, a step 1404 of forming a second metallic layer (M2) in contact with the SAM layer, and a step 1406 of touchlessly removing the second metallic layer M2 that is formed directly above the SAM layer by either agitating the substrate or a fluid in which the substrate is immersed into, or by directing a fluid flow over the second metallic layer M2 to remove parts of the second metallic layer (M2), to form a second electrode, and a nanogap between the first electrode and the second electrode. Note that the term "touchlessly" in this embodiment means a step in which there is no direct contact between the second metallic layer M2 and the operator of the method, i.e., placing a tape on the second metallic layer M2 and then removing the second metallic layer M2. The term "touchlessly" means that either a fluid flow interacts directly with the second metallic layer M2, or the entire device is agitated inside a liquid for achieving the same result. The fluid flow may include a gas flow or a liquid flow.

The method may further include a step of placing the substrate, the first electrode, the SAM layer, and the second metallic layer (M2) in a liquid, where the nanogap has a length smaller than 100 nm or smaller than 20 nm. The step of agitating removes only the parts of the second metallic layer (M2) formed over the SAM layer. The method may further include a step of removing the SAM layer and a step of depositing a material inside the nanogap. The material may be a dielectric material, a semiconductor material, or a conductor.

The method may further include a step of forming a third electrode inside the nanogap, with a first additional nanogap between (i) the first electrode and (ii) the third electrode, and a second additional nanogap between (i) the second electrode and (ii) the third electrode, a step of forming a dielectric material in the first and second additional nanogaps (e.g., on top and around the third electrode, which may be used as a gate electrode), and a step of depositing a semiconductor material in the first and second additional nanogaps to obtain a transistor. In one application, the first electrode is made of aluminum, and the second electrode includes a first layer of titanium and a second layer of platinum. In another application the SAM layer includes octadecylphosphonic acid, and the first electrode is made of a metal different from the second electrode. The method may further include a step of illuminating a material deposited in the nanogap through the first or second electrode, from the top, or through the substrate, to anneal the material.

Figure 15A:
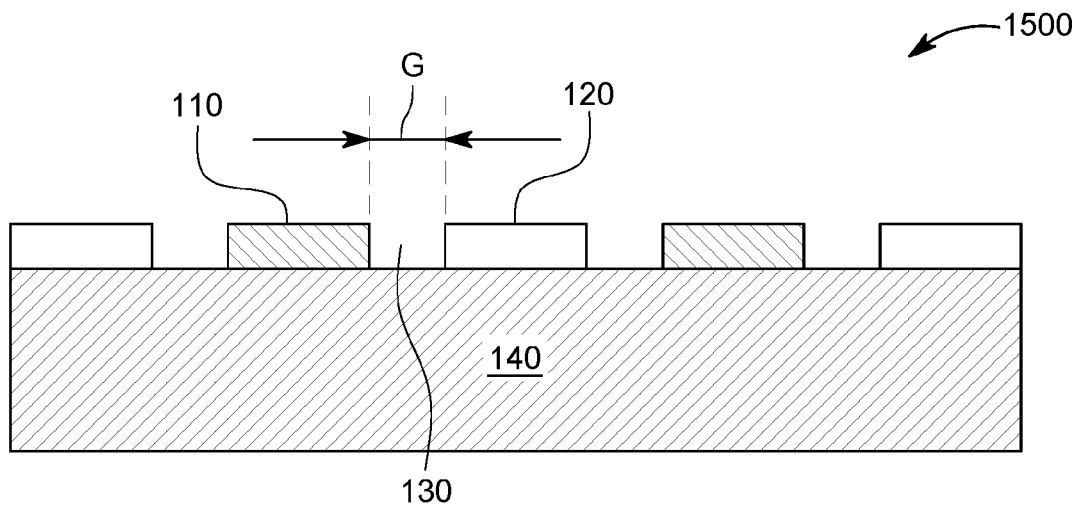
FIGS. 15A to 15C show an interdigitated photovoltaic panel formed with the self-forming nanogap method.
Figure 15B:
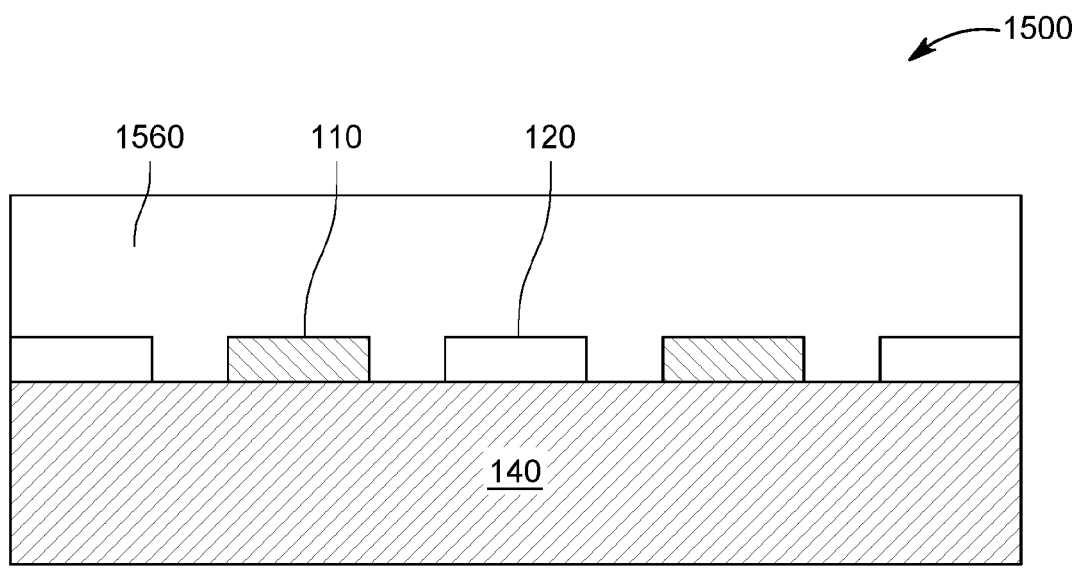
Figure 15C:
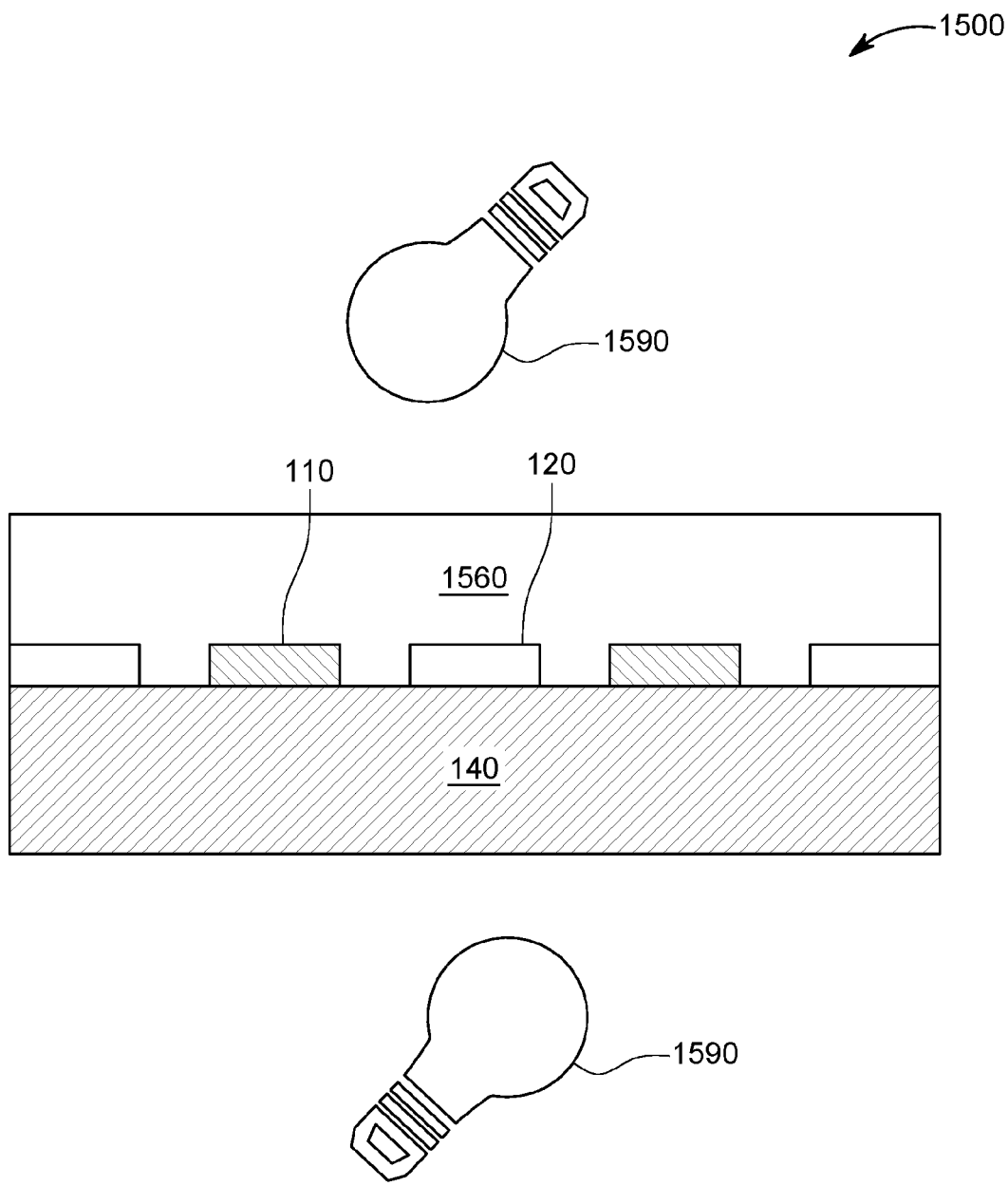

According to another embodiment, which is illustrated in FIGS. 15A to 15C, interdigitated nanogaps as back electrodes are formed on solar cells using the nanogap methods discussed above. The self-forming nanogap electrodes 110 and 120 can be used as planar back contacts for solar cells 140. The electrode materials can be chosen to act as anode/cathode, respectively. These materials can be further processed (e.g., via oxidation) to act as electron and hole transporting layers or selectively doping the substrate 140. Additionally, the interelectrode distance (nanogap) G is on the order of or smaller than the exciton diffusion length in many semiconductors (e.g., organics or perovskites), and thus, the nanogap electrodes 110 and 120 are expected to be very efficient for carrier separation. One or both electrodes can be transparent, to allow further illumination through the substrate 140. In this regard, FIG. 15A shows the electrodes 110 and 120 formed on the substrate 140 with a nanogap 130 generated by the method discussed above with regard to FIG. 2. The substrate 140 may be a photovoltaic panel, i.e., may include plural light converting diodes connected in series or in parallel, each diode being configured to transform the incoming light into electrical current. Any photovoltaic panel known in the art may be used for this embodiment. In one embodiment, a semiconductor layer 1560 may be formed over the first and second electrodes 110 and 120 and also in the gap G, as illustrated in FIG. 15B, to form a photovoltaic cell or panel 1500 with self-forming nanogap electrodes. For this embodiment, the light converting diodes are formed in the layer 1560 and not in the substrate 140. FIG. 15C shows that light (for example, solar light) may be provided from a source 1590 (which may the sun or any other source) either from the semiconductor layer 1560 side, or from the substrate layer 140 side, as at least one of them and one of the first or second electrode is transparent to light.

According to another embodiment, a self-forming nanogap interdigitated electrodes photovoltaic panel 1500 includes a substrate 140 that is configured to transform light energy into electrical energy; a first electrode 110 formed on the substrate 140; a second electrode 120 formed on the substrate 140; a nanogap 130 formed between the first and second electrodes; and a semiconductor layer 1560 formed over the first and second electrodes and into the nanogap. A size of the nanogap is smaller than an excitation diffusion length in the semiconductor layer. The photovoltaic panel may further include a dielectric layer formed over the semiconductor layer; and a top electrode formed over the dielectric layer, where the dielectric layer and the top electrode are transparent to light. In one application, a property of the semiconductor layer is changed by biasing the top electrode.

Figure 16:
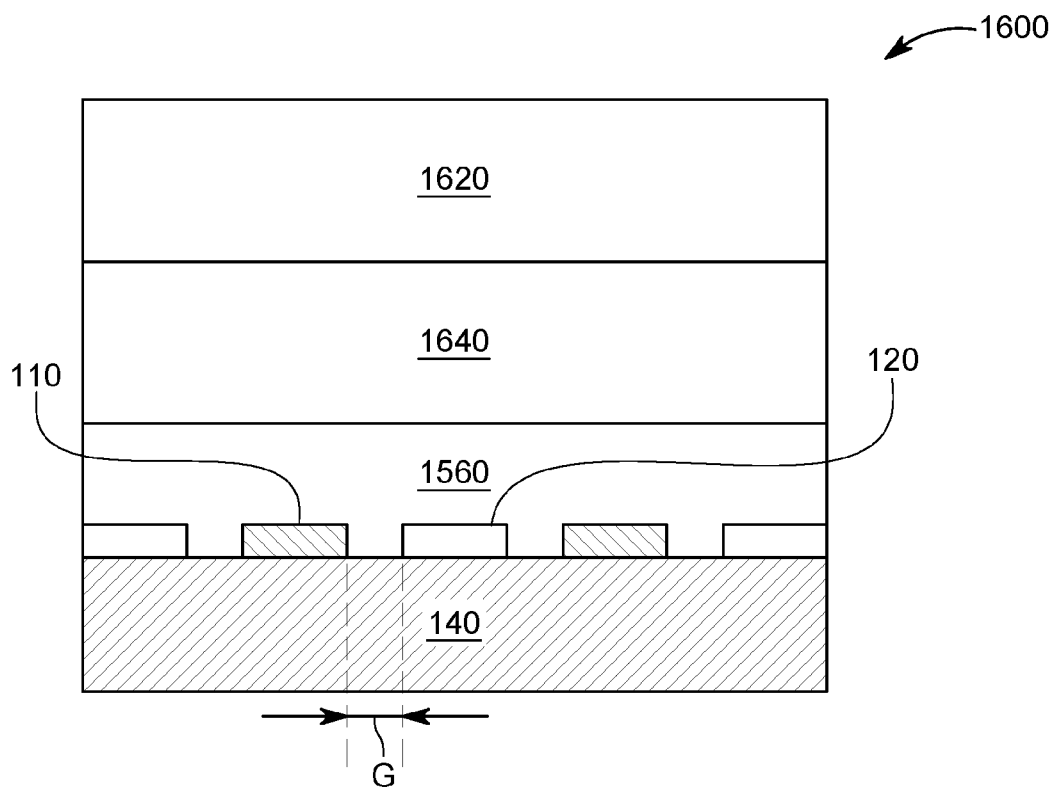
FIG. 16 illustrates a gated interdigitated photovoltaic panel formed with the self-forming nanogap method.

In another embodiment, as illustrated in FIG. 16, a gated photovoltaic panel 1600 is shown having the substrate 140 (which may be any known photovoltaic panel), and first and second electrodes 110 and 120 formed with a nanogap G, based on the method discussed above with regard to FIG. 2. A semiconductor layer 1560 is formed over the first and second electrodes 110 and 120 and the gap G. A dielectric layer 1640 (which may be transparent) is formed over the semiconductor layer 1560 and a top electrode 1620 (which may be transparent) is formed over the dielectric layer 1640. The transparent dielectric layer 1640 and the transparent top electrode 1620 allow to change the properties, e.g., charge carrier density, of the semiconductor layer 1560, thus allowing the fine tuning of one or more parameters of the photovoltaic panel 1600 performance, such as the open circuit voltage, short circuit current, or fill factor, which may increase the power conversion efficiency of the panel. In this regard, the top electrode 1620 may be biased with respect to one of the back electrodes 110 or 120.

The disclosed embodiments provide a new self-forming nanogap method for forming various solid state devices with a small footprint, which would make these devices appropriate components for the IoT environment, allow large scale manufacturing, and offer low-cost solution for many applications. The embodiments are intended to cover alternatives, modifications and equivalents, which are included in the spirit and scope of the invention as defined by the appended claims. Further, in the detailed description of the embodiments, numerous specific details are set forth in order to provide a comprehensive understanding of the claimed invention. However, one skilled in the art would understand that various embodiments may be practiced without such specific details.

Although the features and elements of the present embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

REFERENCES

[1] Beesley, D. J.; Semple, J.; Krishnan Jagadamma, L.; Amassian, A.; McLachlan, M. A.; Anthopoulos, T. D.; DeMello, J. C., "Sub-15-Nm Patterning of Asymmetric Metal Electrodes and Devices by Adhesion Lithography, ". Nat Commun 2014, 5.

What is claimed is:

1. A method for manufacturing a solid state device with a self-forming nanogap, the method comprising:
    patterning a first metallic layer (M1) to form a first electrode on a substrate;
    depositing a self-assembling monolayer, SAM, layer over and around the first electrode;
    forming a second metallic layer (M2) in contact with the SAM layer and the substrate, wherein the second metallic layer includes a first layer in direct contact with the SAM layer and a second layer in contact with the first layer, the first and second layers having different thicknesses and different compositions; and
    removing parts of the second metallic layer (M2) that is formed directly above the SAM layer, to form a second electrode and a nanogap between the first electrode and the second electrode,
    wherein the step of removing comprises:
    placing the substrate, the first electrode, the SAM layer, and the second metallic layer (M2) in a liquid and agitating either the substrate or the liquid, or directing a fluid flow over the second metallic layer (M2).

2. The method of claim 1, wherein the nanogap has a length smaller than 100 nm.

3. The method of claim 1, wherein the nanogap has a length smaller than 20 nm.

4. The method of claim 1, wherein the step of removing removes only the parts of the second metallic layer (M2) formed over the SAM layer.

5. The method of claim 1, further comprising:
    removing the SAM layer from the first metallic layer; and
    depositing a material inside the nanogap.

6. The method of claim 5, wherein the material is a dielectric material, or a piezoelectric material, or a ferroelectric material, or a piezo-resistive material, or an electrolytic material, or an electrolyte material, or a semiconductor layer.

7. The method of claim 5, wherein the material is a conductor.

8. The method of claim 5, further comprising:
    forming a third electrode inside the nanogap, with a first additional nanogap between (i) the first electrode and (ii) the third electrode, and a second additional nanogap between (i) the second electrode and (ii) the third electrode.

9. The method of claim 1, wherein a material of the SAM layer is selected so that the SAM layer adheres to the first electrode but not to the substrate.

10. The method of claim 1, wherein the first electrode is made of aluminum, the first layer includes titanium, and the second layer includes platinum.

11. The method of claim 10, wherein the SAM layer includes octadecylphosphonic acid.

12. The method of claim 1, wherein the first electrode is made of a metal different from a metal of the second electrode.

13. The method of claim 1, further comprising:
    illuminating a material deposited in the nanogap through the first or second electrode, from the top or through the substrate, to anneal the material, wherein the first or second electrode is transparent, or the substrate is transparent.

14. A solid state transistor comprising:
a substrate;
a first electrode formed on the substrate;
a second electrode formed on the substrate, the second electrode including an interlayer and a metallic layer, which is thicker than the interlayer and has a different composition than the interlayer;
a nanogap formed between the first and second electrodes;
a third electrode formed in the nanogap to form additional first and second nanogaps;
a dielectric material formed over the third electrode; and
a semiconductor material formed over the dielectric material,
wherein the dielectric material and the semiconductor material extend into the first and second additional nanogaps.

15. The solid state transistor of claim 14, wherein the first to third electrodes have the same height.

16. The solid state transistor of claim 14, wherein one of the first to third electrodes is transparent.

17. A solid state device comprising:
a substrate;
a first electrode formed on the substrate;
a second electrode formed on the substrate, the second electrode including an interlayer and a metallic layer, which is thicker than the interlayer and has a different composition than the interlayer;
a nanogap formed between the first electrode and the second electrode;
an oxidization layer formed on the first electrode; and
a semiconductor material formed in the nanogap,
wherein the oxidization layer and the semiconductor material extend into the nanogap.

18. The device of claim 17, wherein the first electrode is made of titanium, the oxidization layer is made of titanium oxide, the interlayer is made of titanium, the metallic layer is made of platinum, and the semiconductor material is n-type.

19. A self-forming nanogap interdigitated electrodes photovoltaic cell comprising:
a substrate;
a first electrode formed on the substrate;
a second electrode formed on the substrate, the second electrode including an interlayer and a metallic layer, which is thicker than the interlayer and has a different composition than the interlayer;
a nanogap formed between the first and second electrodes; and
a semiconductor layer formed over the first and second electrodes and into the nanogap,
wherein at least one of the substrate and the semiconductor layer is configured to transform light energy into electrical energy, and
wherein at least one of the substrate, the first electrode, the second electrode, and the semiconductor layer is transparent.

* * * * *